(12) United States Patent
Tanaka et al.

(10) Patent No.: US 8,252,518 B2
(45) Date of Patent: Aug. 28, 2012

(54) CHEMICALLY AMPLIFIED POSITIVE RESIST COMPOSITION AND RESIST PATTERNING PROCESS

(75) Inventors: Akinobu Tanaka, Jyoetsu (JP);
Takanobu Takeda, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 275 days.

(21) Appl. No.: 12/591,540

(22) Filed: Nov. 23, 2009

(65) Prior Publication Data

US 2010/0167207 A1    Jul. 1, 2010

(30) Foreign Application Priority Data

Dec. 25, 2008    (JP) ................. 2008-330945

(51) Int. Cl.
*G03F 7/039* (2006.01)
*G03F 7/20* (2006.01)
*G03F 7/30* (2006.01)
*G03F 7/09* (2006.01)

(52) U.S. Cl. ...... 430/326; 430/5; 430/270.1; 430/271.1; 430/272.1; 430/275.1; 430/905; 430/921

(58) Field of Classification Search .......... None
See application file for complete search history.

(56) References Cited

U.S. PATENT DOCUMENTS

| 5,650,483 | A | 7/1997 | Malik et al. |
| 2002/0081521 | A1 | 6/2002 | Takeda et al. |
| 2002/0192593 | A1* | 12/2002 | Nagai et al. ................. 430/270.1 |
| 2004/0260031 | A1 | 12/2004 | Takeda et al. |
| 2005/0233245 | A1* | 10/2005 | Koitabashi et al. ........ 430/270.1 |
| 2007/0212619 | A1 | 9/2007 | Yoshikawa et al. |
| 2008/0020289 | A1 | 1/2008 | Hatakeyama et al. |
| 2008/0090179 | A1 | 4/2008 | Takeda et al. |
| 2008/0096128 | A1 | 4/2008 | Takeda et al. |
| 2008/0241751 | A1 | 10/2008 | Takeda et al. |
| 2010/0009299 | A1* | 1/2010 | Watanabe et al. ............. 430/326 |

FOREIGN PATENT DOCUMENTS

| JP | A-2002-202610 | 7/2002 |
| JP | A-2003-057826 | 2/2003 |
| JP | A-2003-122011 | 4/2003 |
| JP | A-2004-037514 | 2/2004 |
| JP | A-2004-115630 | 4/2004 |
| JP | A-2005-008766 | 1/2005 |
| JP | A-2005-326833 | 11/2005 |
| JP | A-2007-241060 | 9/2007 |
| JP | A-2007-297284 | 11/2007 |
| JP | A-2008-095009 | 4/2008 |
| JP | A-2008-096684 | 4/2008 |
| JP | A-2008-102383 | 5/2008 |
| JP | A-2008-249762 | 10/2008 |
| TW | 200540569 | 12/2005 |

OTHER PUBLICATIONS

European Search Report issued in Application No. EP 09 01 5144; Completed on May 3, 2010.
Apr. 26, 2012 Office Action issued in Chinese Application No. 200910262157.0 (with partial English translation).

* cited by examiner

*Primary Examiner* — Sin J. Lee
(74) *Attorney, Agent, or Firm* — Oliff & Berridge, PLC

(57) ABSTRACT

There is disclosed a chemically amplified positive resist composition to form a chemically amplified resist film to be used in a lithography, wherein the chemically amplified positive resist composition comprises at least, (A) a base resin, insoluble or poorly soluble in an alkaline solution, having a repeating unit whose phenolic ydroxyl group is protected by a tertiary alkyl group, while soluble in an alkaline solution when the tertiary alkyl group is removed; (B) an acid generator; (C) a basic component; and (D) an organic solvent, and a solid component concentration is controlled so that the chemically amplified resist film having the film thickness of 10 to 100 nm is obtained by a spin coating method. There can be provided, in a lithography, a chemically amplified positive resist composition giving a high resolution with a suppressed LER deterioration caused by film-thinning at the time of forming a chemically amplified resist film with the film thickness of 10 to 100 nm, and a resist patterning process using the same.

3 Claims, 1 Drawing Sheet

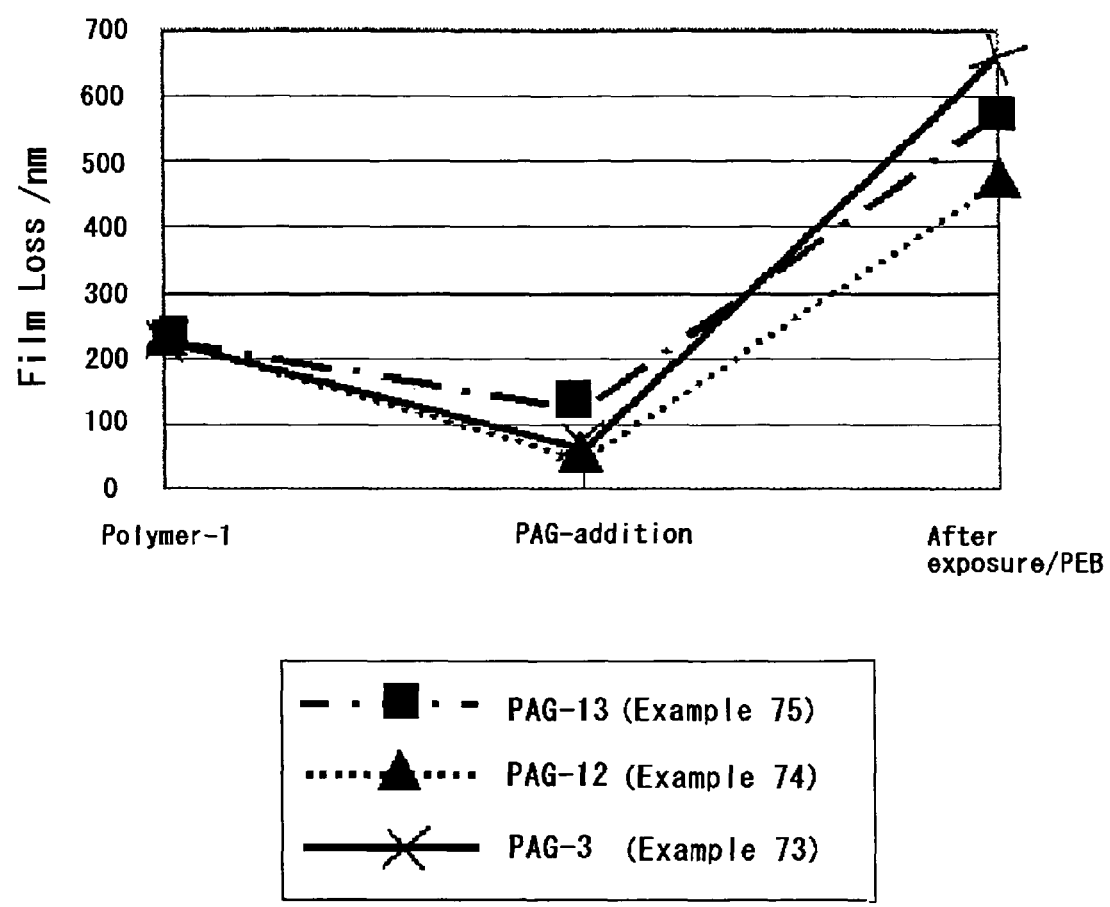

CHEMICALLY AMPLIFIED POSITIVE RESIST COMPOSITION AND RESIST PATTERNING PROCESS

BACKGROUND OF THE INVENTION

1. Field of the Invention

The present invention relates to a chemically amplified positive resist composition used for a lithography in microfabrication of a semiconductor, a photomask blank, and the like, and to a resist patterning process.

2. Description of the Related Art

It is well known that as LSI progresses toward a higher integration and a further acceleration in speed, a miniaturization of a pattern rule is required. Accompanying with this trend, an exposure method and a resist material are drastically changing. In particular, when a lithography of a pattern with 0.2 μm or less is carried out, KrF and ArF excimer laser beams, an electron beam, or the like are used as an exposure light source, and a chemically amplified type showing a good sensitivity to those high energy beams and giving a high resolution is used for a photoresist.

At the present, in a chemically amplified positive resist composition material whose solubility to an aqueous alkaline developer is suppressed by protecting (blocking) a phenolic hydroxy group with an acid labile group, a material mainly including a base resin having an acetal protecting group is generally used. In particular, a substance obtained by reacting a part of the hydroxy group of polyhydroxy styrene with a vinyl ether, which is excellent in a dry-etching resistance, is usually used. And in addition, a reactivity of the acetal protecting group with an acid is excessively high so that the acetal group can be easily removed, thereby leading to a high sensitivity and a high resolution. In order to render an etching resistance further, such a measure as an introduction of an aromatic unit having a condensed ring structure has been taken (for example, Japanese Patent Laid-Open (kokai) No. 2008-95009).

The foregoing base resin for the chemically amplified positive resist composition is used mainly for a KrF exposure resist, and after a lithography by the state-of-the art UV beam is shifted to ArF, it has still been used as a base resin for an electron beam exposure and an extreme ultraviolet beam exposure. For example, as disclosed in Japanese Patent Laid-Open (kokai) No. 2008-95009, a fine pattern with an excellent form having the minimum line width of 80 nm by using the resist film thickness of 240 nm could be successfully formed by a pattern exposure with an electron beam.

Meanwhile, a miniaturization of LSI is further progressed in recent years so that a process dimension is about to cut below 50 nm as the minimum line width. When the process dimension becomes so fine, the resist film thickness needs to be made 100 nm or less in a certain case depending on a surface material of a substrate to be processed in view of such factors as a structural strength to keep its pattern against a developer's surface tension, an adhesion strength to the substrate, and the like.

To address a part of the dry etching resistance problem of a resist film in a dry etching process of such a thin resist film, a method that an etching contrast can be obtained even if a thin resist film is used, such as a multilayer resist method in the case of a semiconductor device processing (for example, Japanese Patent Laid-Open (kokai) No. 2008-96684) and an etching mask film in the case of a photomask processing (for example, Japanese Patent Laid-Open (kokai) No. 2007-241060) are proposed.

As mentioned above, a part of the etching resistance problem is solved by using an etching auxiliary film in the lithography method by a resist film with a film thickness of 100 nm or less, but it became clear that the requirement is not necessarily satisfied in terms of compatibility with a high resolution of the resist film to be used.

It became newly apparent that, when a resist composition conventionally used to form a chemically amplified resist film having a high resolution is attempted to apply to a thin film only by dilution to form a fine pattern with the film thickness of 100 nm or less, a form at the resist pattern edge, so-called line edge roughness (hereinafter, referred to as LER), is drastically deteriorated to be improper.

For example, when a base resin having an acetal protecting group with a high resolution and a high sensitivity was used as the chemically amplified positive resist composition, the problem of drastic deterioration of LER appeared when the film thickness of the chemically amplified resist film became 100 nm or less, even though there was no significant problem of the LER deterioration when the film thickness was 150 nm.

SUMMARY OF THE INVENTION

The present invention was made in view of the foregoing circumstances, and has an object to provide, in a photolithography for microfabrication, in particular in a lithography using an exposure light source such as a KrF laser, an extreme ultraviolet beam, an electron beam, and an X-ray, a chemically amplified positive resist composition giving a high resolution with a suppressed LER deterioration caused by film-thinning at the time of forming a chemically amplified resist film with the film thickness of 10 to 100 nm, and a resist patterning process using the same.

In order to address the foregoing problems, the present invention provides a chemically amplified positive resist composition to form a chemically amplified resist film to be used in a lithography, wherein the chemically amplified positive resist composition comprises at least, (A) a base resin, insoluble or poorly soluble in an alkaline solution, having a repeating unit whose phenolic hydroxy group is protected by a tertiary alkyl group, while soluble in an alkaline solution when the tertiary alkyl group is removed;
(B) an acid generator;
(C) a basic component; and
(D) an organic solvent, and a solid component concentration is controlled so that the chemically amplified resist film having the film thickness of 10 to 100 nm is obtained by a spin coating method.

Accordingly, when a chemically amplified positive resist composition to form a chemically amplified resist film having a film thickness of 10 to 100 nm by a spin coating method, wherein the composition comprises (A) a base resin having a repeating unit whose phenolic hydroxy group is protected by a tertiary alkyl group, (B) an acid generator, (C) a basic component, and (D) an organic solvent, and its solid component concentration is controlled, is used, deterioration of LER caused by film-thinning of the chemically amplified resist film to the film thickness of 10 to 100 nm can be suppressed, and also a high resolution such as to form a pattern with the line width of less than 50 nm can be obtained.

In addition, it is preferable that 95% or more by mol of the repeating unit composing the base resin (A) comprises (p) a repeating unit having a phenolic hydroxy group and (q) a repeating unit whose phenolic hydroxy group is protected by the tertiary alkyl group, each containing an aromatic ring structure directly bonded to a main chain ethylenic carbon atom.

Accordingly, when the repeating unit composing the base resin (A) contains (p) the repeating unit having a phenolic hydroxy group and (q) the repeating unit whose phenolic hydroxy group is protected by the tertiary alkyl group, and the amount of them is 95% or more by mol relative to the repeating unit composing the base resin (A), a high dry etching resistance can be obtained even in the case when a chemically amplified resist film with the film thickness of 100 nm or less is formed.

Further, it is preferable that 95% or more by mol of the repeating unit composing the base resin (A) comprises (p) the repeating unit having a phenolic hydroxy group, (q) the repeating unit whose phenolic hydroxy group is protected by the tertiary alkyl group, and (r) a repeating unit not having the phenolic hydroxy group nor the phenolic hydroxy group protected by an acid labile group, each containing an aromatic ring structure directly bonded to a main chain ethylenic carbon atom.

Accordingly, when (r) the repeating unit not having the phenolic hydroxy group nor phenolic hydroxy group protected by an acid labile group, wherein the units have an aromatic ring structure directly bonded to a main chain ethylenic carbon atom, is contained, a further higher dry etching resistance can be obtained.

Further, 95% or more by mol of the repeating unit composing the base resin (A) comprises preferably any combination of the repeating units represented by the following general formulae (1), (2), and (3):

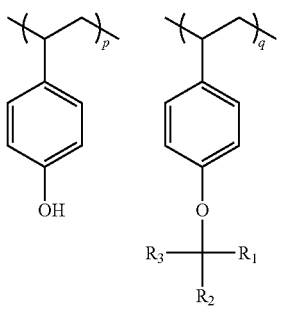

(1)

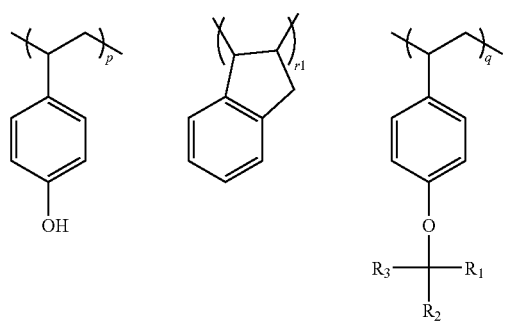

(2)

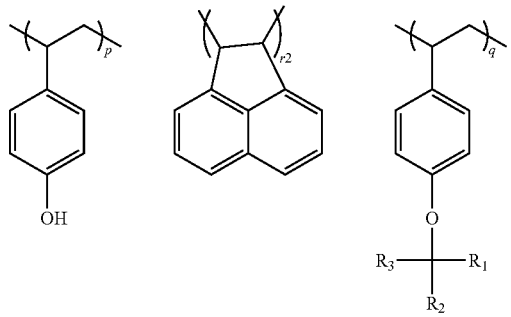

(3)

wherein, each $R_1$, $R_2$, and $R_3$ independently represents a linear, a branched, or a cyclic hydrocarbon group having 1 to 15 carbon atoms, which may optionally contain an oxygen atom; p, q, r1, and r2 represent mol ratio of respective repeating units and are positive numbers.

When a chemically amplified resist film with the film thickness of 10 to 100 nm is formed and a pattern formation is made by using the chemically amplified positive resist composition containing the base resin (A) wherein 95% or more by mol of the base resin is occupied by the foregoing combinations, a high etching resistance and a high resolution can be obtained simultaneously.

Further, it is preferable that $R_1$, $R_2$, and $R_3$ in the above general formulae (1) to (3) be any of the group selected from the group consisting of a methyl group, an ethyl group, a propyl group, an adamantyl group, a norbornyl group, a tetrahydrofurane-2-yl group, a 7-oxanorbornane-2-yl group, a cyclopentyl group, a 2-tetrahydrofuryl group, a tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$.1$^{7,10}$]dodecyl group, a tetracyclo[4.4.0.1$^{2,5}$.1$^{7,10}$]dodecyl group, and 3-oxo-1-cyclohexyl group.

When the chemically amplified positive resist composition containing the base resin (A) having the repeating units having the tertiary alkyl protecting group with these structures is used to form the chemically amplified resist film with the film thickness of 10 to 100 nm and the pattern thereof, a further higher resolution can be obtained.

It is preferable that the acid generator of the (B) component contains at least one or more kinds of compounds represented by the following general formula (4):

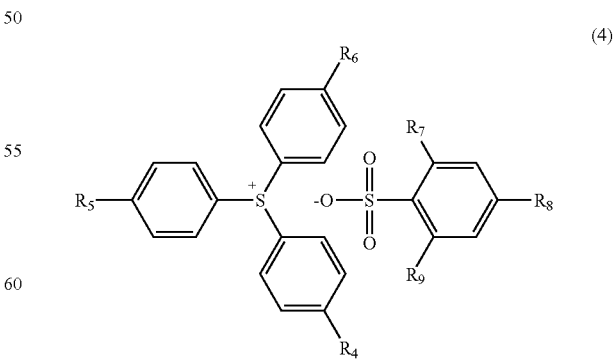

(4)

wherein, $R_4$, $R_5$, and $R_6$ represent a hydrogen atom or a tertiary alkyloxy group having 4 to 10 carbon atoms wherein all of $R_4$, $R_5$, and $R_6$ never are a hydrogen atom; $R_7$, $R_8$, and $R_9$ represent a hydrogen atom, a methyl group, an ethyl group, and an isopropyl group and may be the same or different.

By using the acid generator like this, reduction of the film thickness in an unexposed part at the time of development can be suppressed highly effectively thereby suppressing a decrease in the reaction contrast and giving a further higher resolution, and thus a pattern formation by a thin resist film of a chemically amplified type such as the one having the thickness of 100 nm or less in particular can be done advantageously.

In addition, it is preferable that the basic component of the (C) component contains one or more kinds of an amine compound or an amine oxide compound each having at least a carboxyl group but not having a hydrogen atom covalently bonded to a nitrogen atom as a basic center.

A tertiary alkyl group (protecting group) tends to cause a footing readily relative to an acetal protecting group, but when the basic component like this is used, the footing is strongly suppressed and thus an excellent pattern can be formed. This effect is advantageous in the pattern formation on a nitrogen film such as SiN and TiN, and is advantageously used in the pattern formation on a film of a chromium compound, which tends to cause the footing further more readily than these.

Further, it is preferable that the amine compound or the amine oxide compound each having a carboxyl group but not having a hydrogen atom covalently bonded to a nitrogen atom as a basic center contain at least one or more kinds of compounds represented by the following general formulae (5) to (7):

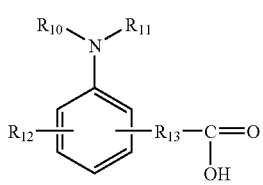

(5)

wherein, each $R_{10}$ and $R_{11}$ represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, or an alkyl thioalkyl group having 1 to 10 carbon atoms; $R_{10}$ and $R_{11}$ may form a ring structure by bonding with each other; $R_{12}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, an alkyl thioalkyl group having 1 to 10 carbon atoms, or a halogen group; $R_{13}$ represents a single bond, a linear, a branched, or a cyclic alkylene group having 1 to 20 carbon atoms, or an arylene group having 6 to 20 carbon atoms.

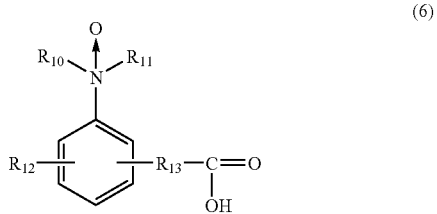

(6)

In the formula, $R_{10}$, $R_{11}$, $R_{12}$, and $R_{13}$ represent the same meanings as before.

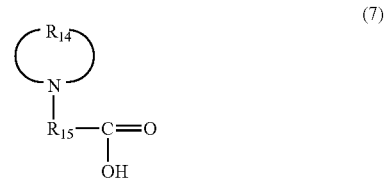

(7)

In the formula, $R_{14}$ represents an optionally substituted linear or branched alkylene group having 2 to 20 carbon atoms, wherein one or a plurality of the groups selected from a carbonyl group, an ether group, an ester group, and a sulfide may be contained between the carbon-carbon bond of the alkylene group; $R_{15}$ represents a linear, a branched, or a cyclic alkylene group having 1 to 20 carbon atoms, or an arylene group having 6 to 20 carbon atoms.

Accordingly, the amine compound or the amine oxide compound each having a carboxyl group but not having a hydrogen atom covalently bonded to a nitrogen atom as a basic center are exemplified by the foregoing general formulae (5) to (7).

Further, it is preferable that the basic component of the (C) component further contain at least one or more kinds of an amine compound and an amine oxide compound represented by the following general formulae (8) and (9):

(8)

(9)

wherein, each $R_{16}$, $R_{17}$, and $R_{18}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, or an alkyl thioalkyl group having 1 to 10 carbon atoms, wherein two of $R_{16}$, $R_{17}$, and $R_{18}$ may form a cyclic structure or an aromatic ring by bonding.

Accordingly, when a chemically amplified positive resist composition, containing the amine compound or the amine oxide compound each having a carboxyl group but not having a hydrogen atom covalently bonded to a nitrogen atom as a basic center, and in addition, at least one or more kinds selected from an amine compound and an amine oxide compound not containing a carboxyl group, is used to form a chemically amplified resist film having the film thickness of 10 to 100 nm, the pattern with an improved resolution thereby having a high resolution can be obtained.

The present invention also provides a resist patterning process to form a resist pattern by a lithography, wherein the chemically amplified positive resist composition is applied on a substrate to be processed by a spin coating method to give a chemically amplified resist film having the film thickness of 10 to 100 nm, which is then exposed to a high energy beam and developed thereafter by using an alkaline developer.

Accordingly, when the chemically amplified resist film having the film thickness of 10 to 100 nm is formed by using the foregoing chemically amplified positive resist composition by a spin coating method, a pattern with the minimum line width of less than 50 nm can be formed and the deterioration of LER due to thinning of the film can be suppressed.

In addition, a photomask blank can be used as the substrate to be processed. And furthermore, it is preferable that a chromium compound film be formed on the outermost surface layer of the photomask blank.

A sheet of photomask affects an entire performance of a semiconductor manufactured by using it, and thus a low LER is required. And in addition, a high etching resistance is required, because the sheet is used for etching of a silicon compound film and a transition metal compound film which contain a transition metal formed by a sputtering method in an etching process, in particular a film with a slow etching speed such as a chromium compound film. Accordingly, the chemically amplified positive resist composition of the present invention can be used advantageously.

It is preferable that a photomask blank with a length of 120 to 180 mm on a side be used as the substrate to be processed and the rotation speed at the time of the foregoing application by the spin coating method be 1,000 to 3,000 revolutions/minute.

Within the foregoing conditions, variation of the film thickness in the plane of the chemically amplified resist film is small with no dimensional change of the pattern, and thus it is preferable.

When the chemically amplified positive resist composition of the present invention is used to form a pattern, deterioration of LER can be remedied and in addition a high resolution with the minimum line width below 50 nm can be obtained. Such improvement could not be obtained in the past when a resist composition with a high etching resistance containing a resin having a repeating unit protected by an acid labile group and giving a resist film of a limit resolution of 65 nm or less with the film thickness of about 150 nm was applied to form the resist film with the film thickness of 100 nm or less. In addition, by selecting an acid generator (B) and a basic component (C) properly, other performance requirements such as an etching resistance and a reaction contrast could be satisfied.

BRIEF DESCRIPTION OF THE DRAWINGS

FIG. 1 shows results of the film loss measurements after addition of the acid generator and development (PAG addition) and after addition of the acid generator, exposure, heat treatment, and development (after exposure/PEB).

DETAILED DESCRIPTION OF THE PREFERRED EMBODIMENTS

Hereinafter, the present invention will be described more specifically.

As mentioned above, there has been a problem that LER is drastically deteriorated when a composition used in the past as the positive resist composition having a high resolution and a high sensitivity is applied to a thin film only by dilution and then formation of a fine pattern having the minimum line width of 50 nm or less is attempted in the film thickness of 100 nm or less.

It is assumed that such LER deterioration is due to an increase of a domain size of a microdomain in the resist film caused at the time of coating and an inhomogeneous reaction due to an uneven distribution of the resist composition component such as an acid generator in the resist film.

In this regard, inventors of the present invention confirmed that the domain size is increased especially when the film thickness is made thinner with an aim to form a finer pattern. It was also confirmed that an uneven distribution of the resist composition in the resist film is remarkable as the resist film is made thinner.

Accordingly, inventors of the present invention carried out the following investigation.

At first, it was assumed that an acid labile acetal group used to form a resist film giving a high resolution as mentioned above reacts by a minute amount of an active acid because of its high reactivity thereby giving a high reaction contrast to the resist film thereby giving a high resolution most advantageously. However, when the microdomain as mentioned above is formed, there is a possibility of different behaviors in dissolution to a developer among fine regions due to its strong effects. Accordingly, inventors of the present invention established a working hypothesis that deterioration of LER is caused by a high reactivity of the acetal protecting group of a phenolic hydroxy group that is responsible for dissolution properties of a resin. Therefore, remedy of the LER deterioration in the film-thinning was tackled firstly while the issue of a high resolution was set aside.

Based on the foregoing working hypothesis, inventors of the present invention investigated if the deterioration of LER could be suppressed by using a tertiary alkyl group which is a non-acetal group having a lower reactivity as compared with the acetal group. As a result, the inventors found that, when a resin having a tertiary alkyl group is used as the protecting group to change dissolution properties to an aqueous alkaline developer, not only the problem of the LER in the pattern formation by a resist film having the thickness of 100 nm or less could be solved but also a high resolution such as to resolve a pattern with the minimum line width below 50 nm could be obtained.

Firstly, a base resin, used in the present invention as the component (A) having a repeating unit whose phenolic hydroxy group is protected by a tertiary alkyl group, wherein the base resin is insoluble or poorly soluble in an alkaline solution while soluble when the tertiary alkyl group is removed, will be explained.

The base resin of the component (A) used in the present invention has a phenolic hydroxy group protected by a tertiary alkyl group, as mentioned above.

It is preferable that the repeating unit composing the foregoing base resin include (q) a repeating unit having a phenolic hydroxy group protected by a tertiary alkyl group to change a solubility to an aqueous alkaline developer as mentioned above, and (p) a repeating unit having a phenolic hydroxy group to obtain an adhesion to the substrate.

In addition to (p) the repeating unit having a phenolic hydroxy group and (q) the repeating unit whose hydroxy group is protected by a tertiary alkyl group, (r) a repeating unit not having a phenolic hydroxy group nor a phenolic hydroxy group protected by an acid labile group may be included with the aim to give a further higher etching resistance and the like.

When 95% or more by mol of the repeating unit composing the base resin (A) comprises a combination of the foregoing repeating units, a high etching resistance can be obtained with the film thickness of 100 nm or less.

The foregoing repeating units have an ethylene moiety to form a main chain by polymerization, and thus the base resin can be obtained by polymerizing each ethylene moiety by a heretofore known radical polymerization (for example, Japanese Patent Laid-Open (kokai) No. 2008-95009), an anionic polymerization (for example, Japanese Patent Laid-Open (kokai) No. 2005-008766), or the like. To obtain these polymerization properties, a conjugate system with the ethylene moiety is necessary, and to obtain a high etching resistance, it is preferable to use a monomer whose ethylene moiety is directly bonded to an aromatic ring as this conjugate system.

Various monomer skeleton can be used as far as the foregoing ethylene moiety is directly bonded to an aromatic ring. In particular, a styrene skeleton generally used in polymerization, an indene skeleton and an acenaphthylene skeleton further having a ring formed by an ethylene moiety, are useful because they have good polymerization properties and give a high resolution.

A substituted aromatic ethylene derivative as (q) a repeating unit whose phenolic hydroxy group is protected by the tertiary alkyl group, containing an aromatic ring structure directly bonded to a main chain ethylenic carbon atom, may be obtained, for example, by introducing a tertiary alkyl group into the phenolic hydroxy group of an aromatic compound, containing an ethyl group and a phenolic hydroxy group, by a standard addition reaction under an acidic condition with an isobutene derivative substituted by an alkyl group whose methyl group or methylene group may optionally contain a hydrogen or partially an oxygen-containing functional group, which is followed further by dehydrogenation of the ethyl group. This method can be utilized even more conveniently, if the method using an industrially available ethylbenzene having a phenolic hydroxy group is used.

It is preferable that the tertiary alkyl group used therein have 4 to 18 carbon atoms in order to obtain a produced polymerizable monomer by distillation. As the alkyl substituent group contained at a tertiary carbon of the tertiary alkyl group, a linear, a branched, or a cyclic alkyl group having 1 to 15 carbon atoms which may partially contain an oxygen-containing functional group such as an ether bond and a carbonyl group may be exemplified, wherein these substituent groups may also form a ring by bonding among themselves.

Examples of the preferable substituent groups of the foregoing tertiary alkyl carbon include a methyl group, an ethyl group, a propyl group, an adamantly group, a norbornyl group, a tetrahydrofurane-2-yl group, a 7-oxanorbornane-2-yl group, a cyclopentyl group, a 2-tetrahydrofuryl group, a tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$.1$^{7,10}$]dodecyl group, a tetracyclo[4.4.0.1$^{2,5}$.1$^{7,10}$]dodecyl group, and a 3-oxo-1-cyclohexyl group. Specific Examples of the tertiary alkyl group include a t-butyl group, a t-pentyl group, a 1-ethyl-1-methylpropyl group, a 1,1-diethylpropyl group, a 1,1,2-trimethylpropyl group, a 1-adamantyl-1-methylethyl group, a 1-methyl-1-(2-norbonyl)ethyl group, a 1-methyl-1-(tetrahydrfofurane-2-yl)ethyl group, a 1-methyl-1-(7-oxanorbornane-2-yl)ethyl group, a 1-methylcyclopentyl group, a 1-ethylcyclopentyl group, a 1-propylcyclopentyl group, a 1-cyclopentylcyclopentyl group, a 1-cyclohexylcyclopentyl group, a 1-(2-tetrahydrofuryl)cyclopentyl group, a 1-(7-oxanorbornane-2-yl)cyclopentyl group, a 1-methylcyclohexyl group, a 1-ethylcyclohexyl group, a 1-cyclopentylcyclohexyl group, a 1-cyclohexylcyclohexyl group, a 2-methyl-2-norbornyl group, a 2-ethyl-2-norbonyl group, a 8-methyl-8-tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$.1$^{7,10}$]dodecyl group, a 3-ethyl-3-tetracyclo[4.4.0.1$^{2,5}$.1$^{7,10}$]dodecyl group, a 2-methyl-2-adamantyl group, a 2-ethyl-2-adamantyl group, a 1-methyl-3-oxo-1-cyclohexyl group, a 1-methyl-1-(tetrahydrofurane-2-yl)ethyl group, a 5-hydroxy-2-methyl-2-adamantyl group, and a 5-hydroxy-2-ethyl-2-adamantyl group, but are not limited to them.

Further, (p) the foregoing repeating unit having a phenolic hydroxy group and an aromatic ring structure directly bonded to a main chain ethylenic carbon atom can be introduced by polymerizing a similar material to the foregoing without protecting by the tertiary alkyl group. However, in general, polymerization is carried out after protection by a protecting group such as an acetyl group and deprotection is followed after the polymerization. Although a styrene derivative protected by an acetyl group is industrially available and thus can be used conveniently, an indene derivative having a phenolic hydroxy group is also known (Japanese Patent Laid-Open (kokai) No. 2002-202610). A compound having other skeletons may also be used.

Further, (r) the foregoing repeating unit having an aromatic ring structure directly bonded to a main chain ethylenic carbon atom and not having the phenolic hydroxy group nor the phenolic hydroxy group protected by an acid labile group is introduced with such an aim as to improve an etching resistance as necessary. Although an etching resistance can be somewhat improved by introduction of styrene or a styrene having a hydrocarbon chain, it is preferable that the ethylene moiety that forms a main chain by polymerization further form a ring, and thus monomers such as indene and acenaphthylene are preferably used.

Other than the foregoing three units (p), (q), and (r), an aromatic ring-substituted ethylene monomer unit heretofore known for the resist use having a phenolic hydroxy group protected with an acetal group (for example Japanese Patent Laid-Open (kokai) No. 2008-95009), a heretofore known (meth)acrylic acid derivative unit, and a vinyl ether unit may be added without impairing the effects of the present invention if the rough amount of them is less than 5% by mol. However, in order to obtain the resin with a stable quality and a sufficient etching resistance, a composition not containing a unit other than the foregoing three units (p), (q), and (r) is more preferable.

As the preferable and more specific combination of the foregoing repeating units of the base resin (A) in the present invention, the combination of the repeating units represented by the following general formulae (1) to (3) may be mentioned.

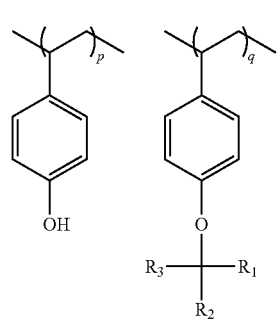

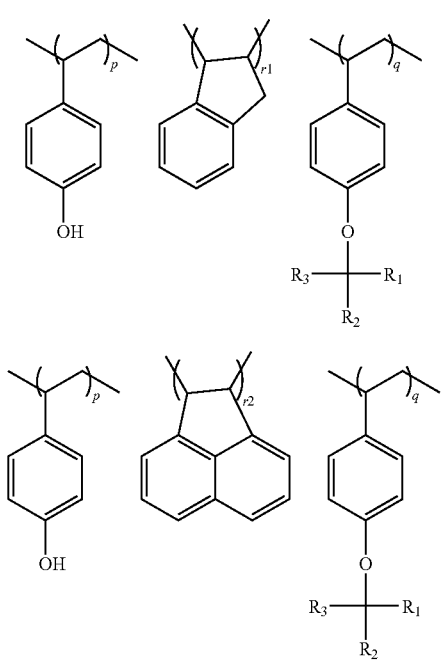

Among the combinations of the monomer units shown by the general formulae (1) to (3), ratio of the monomer units in the general formula (1) is preferably 0<p/(p+q)<0.8 and more preferably 0.4<p/(p+q)<0.8; preferably 0<q/(p+q)<0.6 and more preferably 0.1<q/(p+q)<0.6.

In the general formula (2), the ratio is preferably 0<p/(p+q+r1)<0.8 and more preferably 0.3<p/(p+q+r1)<0.8; preferably 0<q/(p+q+r1)<0.5 and more preferably 0.1<q/(p+q+r1)<0.5; and preferably 0<r1/(p+q+r1)<0.35.

In the general formula (3), the ratio is preferably 0<p/(p+q+r2)<0.8 and more preferably 0.3<p/(p+q+r2)<0.8; preferably 0<q/(p+q+r2)<0.5 and more preferably 0.1<q/(p+q+r2)<0.5; and preferably 0<r2/(p+q+r2)<0.3.

When the ratio of p is 0.8 or more, an alkaline-dissolution rate of an unexposed part becomes too fast thereby causing a problem in the pattern formation after development in a certain case. When the ratio of q is 0.1 to 0.6, there is no fear of deterioration of the resolution nor causing a defect after development.

By increasing the ratio of r1 and r2, a dry etching resistance can be improved. When the ratio of r1 is 0.35 or less and the ratio of r2 is 0.3 or less, there is no fear of decrease in the resolution.

By properly selecting the values of p, q, r1, and r2 within the foregoing ranges, a resolution, an etching resistance, and a pattern form can be controlled arbitrarily.

The weight-average molecular weight (measured by a instrument of a gel permeation chromatography HLC-8120 GPC, manufactured by Tosoh Corp., using polystyrene as the standard sample) of the base resin (A) contained in the chemically amplified positive resist composition of the present invention is preferably in the range of 1,000 to 50,000.

When the weight-average molecular weight is 1,000 or more, there is no chance of insufficient heat resistance of the resist material, and when 50,000 or less, there is no chance of decrease in solubility in an alkaline solution leading to deterioration of LER in the resist pattern after development.

When the molecular weight distribution (Mw/Mn) of a copolymer comprising repeating units of the general formulae (1), (2), and (3) in the base resin (A) contained in the chemically amplified positive resin composition of the present invention is narrow, there are low risks to form foreign spots on the pattern after exposure and to deteriorate a pattern form caused by the presence of a polymer with a high and a low molecular weight. As the pattern rule is progressing toward miniaturization, effects of the molecular weight and the molecular weight distribution tend to become significant, and thus in order to obtain a resist composition suitable for the fine pattern dimension, the molecular weight distribution of a multicomponent copolymer to be used is preferably 1.0 to 2.5, in particular a low degree of dispersion ranging form 1.0 to 1.8 is preferable.

As to the acid generator (B) contained in the chemically amplified positive resist composition of the present invention, a heretofore known acid generator usable in a chemically amplified resist film (for example, Japanese Patent Laid-Open (kokai) No. 2008-249762) can be used basically.

As to the suitable photo acid generator, the photo acid generators with a type including a sulfonium salt, an iodonium salt, a sulfonyl diazomethane, and an N-sulfonyl oxyimide may be mentioned, and they may be used singly or in a combination of two or more kinds. Examples of preferable counter anions possessed by the sulfonic acids generated from the foregoing salts or compounds include a benzene sulfonic acid anion, a toluene sulfonic acid anion, a 4-(4-toluenesulfonyloxy)benzene sulfonic acid anion, a pentafluorobenzene sulfonic acid anion, a 2,2,2-trifluoroethane sulfonic acid anion, a nonafluorobutane sulfonic acid anion, a heptadecafluorooctane sulfonic acid anion, and a camphor sulfonic acid anion.

The adding amount of the acid generator (B) contained in the chemically amplified positive resist composition of the present invention is not particularly restricted, but preferably 0.4 to 20 parts by mass and more preferably 0.8 to 15 parts by mass relative to 100 parts by mass of the base resin of the (A) component.

It may be expected that the sensitivity can be secured and the deterioration of LER can be suppressed by increasing the adding amounts of this acid generator (B) and the below-mentioned basic component (C) simultaneously. However, when the adding amount of the acid generator (B) is more than 20 parts by mass, a further improvement effect in the sensitivity is generally low, and thus there is a possibility of a less economy. When the amount is less than 0.4 parts by mass, there is a possibility of LER deterioration in the resist pattern to be formed because the amount of the basic component (C) must be made low in order to satisfy the required sensitivity.

Especially when the resist film is formed for exposure by a radial ray or an electron beam, the adding amount of the acid generator is made preferably in the range of about 2.0 to about 20 parts by mass, which is a higher concentration as compared with the case of using an excimer laser beam, because there is no problem of energy decay of the exposure beam in the film due to addition of the acid generator (B) while obtaining a high sensitivity is difficult.

Among the foregoing acid generators, when the acid generator represented by the following general formula (4)

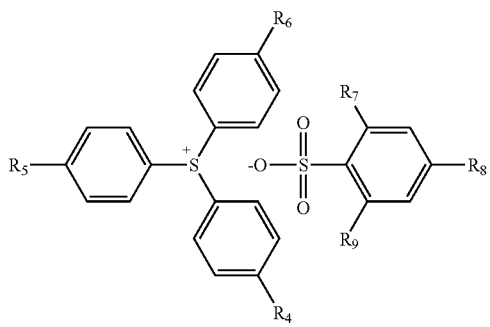

(4)

(wherein, $R_4$, $R_5$, and $R_6$ represent a hydrogen atom, or a tertiary alkyloxy group having 4 to 10 carbon atoms, wherein all of $R_4$, $R_5$, and $R_6$ never are a hydrogen atom; $R_7$, $R_6$, and $R_9$ represent a hydrogen atom, a methyl group, an ethyl group, and an isopropyl group, and may be the same or different) is used singly or in a combination of two or more kinds of the acid generators only represented by the general formula (4), or in a certain case, when the acid generator represented by the general formula (4) is used in a combination so that its amount in the combination is roughly 80% or more by mol, an especially highly sensitive and an excellent pattern can be obtained in the combination with the foregoing base resin (A). Even more desirable effects can be obtained especially when the acid generator represented by the general formula (4) is used singly or in a combination of two or more kinds represented only by the general formula (4).

The foregoing acid generator represented by the general formula (4) has been used from the past, and recently was used also in the resist of a type containing a base resin whose phenolic hydroxy group is protected by an acetal group (for example, Japanese Patent Laid-Open (kokai) No. 2008-95009). This acid generator is known to give a form with a prominent head in the pattern's cross section when applied to a highly reactive resin having an acid labile group such as an acetal group. Accordingly, in the case when the acid generator is used for the positive resist giving an intended pattern with the minimum line width of less than 100 nm, if the acid generator is used singly or in a way similar to it as mentioned above, a prominence (so-called T-top) is prone to be formed on the pattern surface. Therefore, it has been a general practice to use it in a combination with other acid generators in the amount not to form the prominent head in the pattern.

However, in the case that solubility of the resin to a developer changes by the tertiary alkyl group as in the case of the base resin (A) contained in the chemically amplified positive resist composition of the present invention, the tertiary alkyl group contained in the acid generator like the general formula (4) can be disconnected synchronously with the resin under an extremely similar reaction condition of the resin because the acid generator like the general formula (4) has the phenolic hydroxy group protected by the tertiary alkyl group of the same line. In addition, the acid generator whose protecting group is disconnected can improve the reaction contrast because it has a dissolution acceleration effect. Namely, when the acid generator represented by the general formula (4) is used, an extremely high dissolution-inhibiting effect is expressed in the unexposed part of the resist film thereby suppressing the film loss and at the same time a desirable pattern form without the surface prominence can be obtained. Accordingly, when the acid generator (B) as mentioned above is used, decrease in the reaction contrast due to the lowered reactivity caused by the use of the tertiary alkyl group as the acid labile group in the base resin (A) can be remedied. Meanwhile, the effect not forming the T-top form with suppressing the film loss can be obtained independent of the film thickness, and thus advantageous effects can be obtained even when the resin protected by the tertiary alkyl group is used as the resin for the resist film with the film thickness of 100 nm or more.

The benzene sulfonic acid moiety, the counter anion in the general formula (4), is appropriately tailored by the alkyl group introduced into the benzene nuclear between the aim to control an acid diffusion and the control of the pattern form. The diffusion can be suppressed in the order of a methyl group<an ethyl group<an isopropyl group, with simultaneous decrease in the resist sensitivity. Basically, the suppressed acid diffusion tends to give an improved resolution, but in the resin introduced with more repeating unit having an aromatic ring structure directly bonded to a main chain ethylenic carbon atom and not having the phenolic hydroxy group nor the phenolic hydroxy group protected by an acid labile group (r), a prominent head is formed in the pattern form in a certain case.

The tertiary alkyl group contained in the tertiary alkyloxy group in the compound represented by the general formula (4) is selected basically from the same range of the tertiary alkyl group used to protect the foregoing resin component (A). However, when a material containing an oxygen atom is used, selection of the material having an ether bond as the oxygen-containing functional group is preferable from the synthesis viewpoint.

As the basic component (C) contained in the chemically amplified positive resist composition of the present invention, basically as in the case of the acid generator, a heretofore known basic component usable in a chemically amplified resist (for example, as disclosed in Japanese Patent Laid-Open (kokai) No. 2008-249762 and so on) can be used. Examples of them include primary, secondary, and tertiary aliphatic amines, mixed amines, aromatic amines, heterocyclic amines, a nitrogen-containing compound having a carboxy group, a nitrogen-containing compound having a sulfonyl group, a nitrogen-containing compound having a hydroxy group, a nitrogen-containing compound having a hydroxyphenyl group, an alcoholic nitrogen-containing compound, an amide derivative, and an imide derivative.

The basic component (C) may be used singly or in a combination of two or more kinds, and its amount is usually 0.01 to 2 parts by mass and particularly preferably 0.01 to 1 parts by mass, relative to 100 parts by mass of the base resin. When the amount is too small, effects of the addition cannot be obtained, and when the amount is more than 2 parts by mass, an excessive decrease in sensitivity may occur in a certain case.

Among the basic component (C), the amine compound or the amine oxide compound each having a carboxyl group but not having a hydrogen atom covalently bonded to a nitrogen atom as a basic center is an especially advantageous material in the case such that an undissolved part (so-called footing profile) is formed at the pattern edge near to the substrate when other basic component is used for the base resin (A) protected by the tertiary alkyl group, because such problem can be solved.

Substrates susceptible to the footing like this include nitride substrates such as TiN, SiN, and SiON. The footing can occur very easily especially when its surface is formed of a chromium metal or a chromium compound containing nitrogen and/or oxygen, and thus the foregoing amine or amine oxide compound is extremely effective to solve this problem.

Preferable chemical structure example of the above-mentioned amine compound or amine oxide compound each having a carboxyl group but not having a hydrogen atom covalently bonded to a nitrogen atom as a basic center are an amine compound or amine oxide compound represented by the following general formula (5) to (7), but are not particularly restricted to these example.

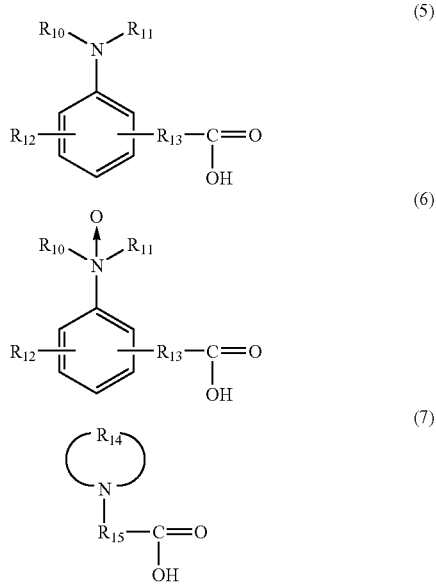

(In the formulae, each $R_{10}$ and $R_{11}$ represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, or an alkyl thioalkyl group having 1 to 10 carbon atoms; $R_{10}$ and $R_{11}$ may form a ring structure by bonding with each other; $R_{12}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, an alkyl thioalkyl group having 1 to 10 carbon atoms, or a halogen group; $R_{13}$ represents a single bond, a linear, a branched, or a cyclic alkylene group having 1 to 20 carbon atoms, or an arylene group having 6 to 20 carbon atoms; $R_{14}$ represents an optionally substituted linear or branched alkylene group having 2 to 20 carbon atoms, wherein one or a plurality of the groups selected from a carbonyl group, an ether group, an ester group, and a sulfide may be contained between the carbon-carbon bond of the alkylene group; $R_{15}$ represents a linear, a branched, or a cyclic alkylene group having 1 to 20 carbon atoms, or an arylene group having 6 to 20 carbon atoms.)

Without any limitations, examples of an aryl group having 6 to 20 carbon atoms concretely include a phenyl group, naphthyl group, anthryl group, phenanthryl group, pyrenyl group, naphthacenyl group, and fluorenyl group; examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of an aralkyl group having 7 to 20 carbon atoms concretely include a benzyl group, phenethyl group, phenylpropyl group, naphthylmethyl group, naphthylethyl group, and anthracenylmethyl group; examples of a hydroxyalkyl group having 2 to 10 carbon atoms concretely include a hydroxymethyl group, hydroxyethyl group, and hydroxypropyl group; examples of an alkoxyalkyl group having 2 to 10 carbon atoms concretely include a methoxymethyl group, ethoxymethyl group, propoxymethyl group, isopropoxymethyl group, butoxymethyl group, isobutoxymethyl group, tert-butoxymethyl group, tert-amyloxymethyl group, cyclohexyloxymethyl group, cyclopentyloxymethyl group; examples of an acyloxyalkyl group having 2 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; examples of an alkylthio-alkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group; examples of an alkylene group having 1 to 20 carbon atoms concretely include a methylene group, ethylene group, methylethylene group, dimethylethylene group, propylene group, methylpropylene group, butylene group, pentylene group, hexylene group, decanyl group, cyclopentylene group, cyclohexylene group, methylenecyclohexylene group, decahydronaphthalenylene group; and examples of an arylene group having 6 to 20 carbon atoms concretely include phenylene group, naphthylene group, anthrylene group, phenanthrylene group, pyrenylene group, naphthacenylene group, and fluorenylene group.

Preferable examples of the amine compounds represented by the general formula (5) will be concretely enumerated below, without limited thereto.

Namely, such examples include: o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl) benzoic acid, and 2-(4-(dibutylamino)-2-hydroxybenzoyl) benzoic acid.

Preferable example of the amine oxide compound represented by the general formula (6) is compound obtained by oxidizing each of the amine compounds represented by the general formula (5) and concretely enumerated above, without limited thereto.

Preferable examples of the amine compound represented by the general formula (7) will be concretely enumerated below, without limited thereto.

Namely, examples thereof include 1-piperidinepropionic acid, 1-piperidinebutyric acid, 1 piperidinemalic acid, 1-piperidinepyruvic acid, 1-piperidinelactic acid, and the like.

The amine oxide structure represented by the general formula (6) are to be produced by selecting optimum techniques corresponding to the structures of the compounds, respectively. Examples thereof include a technique to adopt an oxidation reaction using an oxidizing agent for a nitrogen-containing compound, and a technique to adopt an oxidation reaction of a nitrogen-containing compound in a diluted solution of hydrogen peroxide, without limited thereto. This will be explained in detail.

Exemplarily described below is a production method of a nitrogen-containing alcohol compound by an esterification reaction, and this is also applicable to synthesis of the compound represented by the general formula (6).

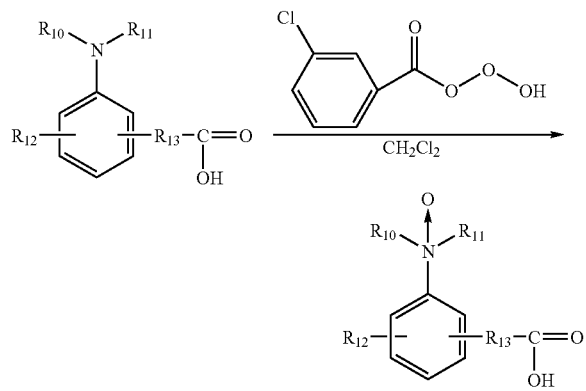

In the above formula, although this reaction is an oxidation reaction of amine adopting an oxidizing agent (m-chloroperbenzoic acid), this reaction can be conducted by another oxidizing agent in a usual manner of an oxidation reaction. After the reaction, mixed reaction products can be purified by usual manners such as distillation, chromatography, recrystallization, and the like (for details thereof, see Japanese Patent Laid-open (kokai) No 2008-102383).

When the foregoing amine compound or amine oxide compound each having a carboxyl group but not having a hydrogen atom covalently bonded to a nitrogen atom as a basic center is used in the present invention as the basic component (C), a generated acid is promptly captured by the presence of a functional group substituted to the nitrogen atom, while the carboxyl group is arranged in the substrate side thereby inhibiting the deactivation of the generated acid caused by diffusion to the substrate, and thus a pattern form with a high resolution and an excellent verticality at the substrate surface can be obtained. Accordingly, when the amine compound or the amine oxide compound each having a carboxyl group but not having a hydrogen atom covalently bonded to a nitrogen atom as a basic center is appropriately tailored based on its physical properties such as volatility, basicity, an acid-capturing rate, and a diffusion rate in the resist, in accordance with a combination with the base resin (A) and the acid generator (B) to be used, a further desirable pattern form can be obtained.

However, an amine compound or an amine oxide compound, even having a carboxyl group, having a hydrogen atom covalently bonded to a nitrogen atom as a basic center, like a primary amine, has no remedy effect of the undercut and footing to the foregoing substrate. To realize the effect to the maximum extent, a tertiary amine not containing a hydrogen atom covalently bonded to a nitrogen atom as a basic center is preferable.

Although an amine compound having a nitrogen atom included in an aromatic ring, such as 2-quinoline carboxylic acid and nicotinic acid, does not contain a hydrogen atom covalently bonded to the nitrogen atom which plays a central role as the base, it is supposed that the carboxyl group cannot array on the substrate side well because of its weak basicity. Accordingly, deactivation of the generated acid due to diffusion to the substrate cannot be prevented from occurring.

The effect to suppress a footing profile by the amine compound or the amine oxide compound each having a carboxyl group but not having a hydrogen atom covalently bonded to a nitrogen atom as a basic center is based on the localization to near the substrate owing to the carboxyl group as explained above. Accordingly, in order to obtain its effect, the entire basic component (C) does not necessarily need to be the amine compound or the amine oxide compound each having a carboxyl group but not having a hydrogen atom covalently bonded to a nitrogen atom as a basic center. Thus, the foregoing amine compound or amine oxide compound each having a carboxyl group but not having a hydrogen atom covalently bonded to a nitrogen atom as a basic center can be used in a combination with non-'amine compound or amine oxide compound each having a carboxyl group but not having a hydrogen atom covalently bonded to a nitrogen atom as a basic center' of a usually used basic component.

When the amine compound or the amine oxide compound each having a carboxyl group but not having a hydrogen atom covalently bonded to a nitrogen atom as a basic center is used with an basic component other than the amine compound or the amine oxide compound each having a carboxyl group but not having a hydrogen atom covalently bonded to a nitrogen atom as a basic center, as mentioned above, the blending ratio (mass ratio) of the amine compound or the amine oxide compound each having a carboxyl group but not having a hydrogen atom covalently bonded to a nitrogen atom as a basic center to the other basic component is preferably in the range from 100:0 to 10:90.

As can be seen in the above, even when the pattern profile change takes place near to the substrate because of the decrease in reactivity of the acid-labile tertiary alkyl group of the base resin (A) in the chemically amplified resist composition of the present invention, the pattern profile change near to the substrate can be suppressed by using, as the basic component (C), the amine compound or the amine oxide compound each having a carboxyl group but not having a hydrogen atom covalently bonded to a nitrogen atom as a basic center.

An organic solvent using for controlling a solid component concentration of the chemically amplified positive resist composition of the present invention are any organic solvents in which (A) the base resin, (B) the acid generator, (C) the basic component, other additives, and the like are soluble. Examples of the organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely, or mixedly in two or more kinds, without limited thereto. Desirably usable in the present invention among them, are ethyl lactate, propylene glycol monomethyl ether, propylene glycol monomethyl ether acetate, and mixed solvents of them, since they are most excellent in solubility for the acid generator in the resist components.

The usage amount of the organic solvent is preferably 1,000 to 10,000 parts, and particularly 2,000 to 9,700 parts relative to 100 parts of the base resin. In the present invention, controlling the solid component concentration of the chemically amplified positive resist composition to be the above-mentioned concentration and using the spin coating method, the chemically amplified resist film having the film thickness of 10 to 100 nm can be obtained with stability and evenness (smoothness).

To improve a coatability of the chemically amplified resist composition of the present invention, it is possible to add thereto a conventional surfactant (E), as an optional component in addition to the above enumerated components. Note that the optional component may be added in an ordinary amount within a range, which does not obstruct the effect of the present invention.

Examples of surfactant (E) include, without particular limitation, polyoxyethylene alkyl ethers such as polyoxyethylene lauryl ether, polyoxyethylene stearyl ether, polyoxyethylene cetyl ether, and polyoxyethylene olein ether;

polyoxyethylene alkyl alyl ethers such as polyoxyethylene octyl phenol ether, and polyoxyethylene nonyl phenol ether;

polyoxyethylene polyoxypropylene block copolymers;

sorbitan fatty acid esters such as sorbitan monolaurate, sorbitan monopalmitate, and sorbitan monostearate;

nonionic surfactants of polyoxyethylene sorbitan fatty acid ester, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate;

fluorinated surfactants such as F TOP EF301, EF303, EF352 (produced by JEMCO Inc.), MEGAFAC F171, F172, F173, R08, R30, R90, R94 (produced by Dai-Nippon Ink & Chemicals, Inc.), Fluorad FC-430, FC-431, FC-4430, FC-4432 (produced by Sumitomo 3M Co., Ltd.), ASAHI-GUARD AG710, SURFLON S-381, S-382, S-386, SC101, SC102, SC103, SC104, SC105, SC106, SURFINOL E1004, KH-10, KH-20, KH-30, KH-40 (produced by Asahi Glass Co.);

organosiloxane polymers KP341, X-70-092, X-70-093 (produced by Shin-Etsu Chemical Co., Ltd.); and acrylic or methacrylic POLYFLOW No. 75, No. 95 (produced by Kyoeisha Yushi Kagaku Kogyo Co., Ltd.); and those surfactants are also preferably used, which are partially fluorinated oxetane ring-opening polymers having the following structure because these surfactants have advantage in small effecting to a coatability of the resist even if the addition amount is changing:

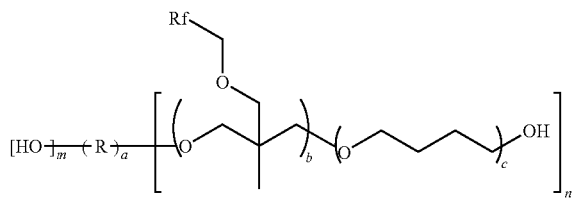

(surf-1)

In the formula, R represents an aliphatic group having valence of 2 to 4 and having 2 to 5 carbon atoms, and concrete examples thereof include: ethylene, 1,4-butylene, 1,2-propylene, 2,2-dimethyl-1,3-propylene, 1,5-pentylene as divalent ones; and those represented by the following formulae, as trivalent and tetravalent ones:

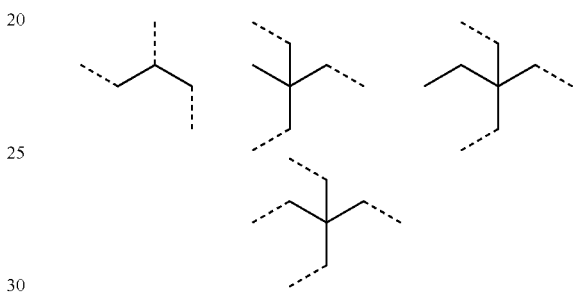

(In the formula, broken lines represent bonding hands, and the structures are partial ones derived from glycerol, trimethylolethane, trimethylolpropane, and pentaerythritol, respectively.)

To be preferably used among them are 1,4-butylene, and 2,2-dimethyl-1,3-propylene. Rf is a trifluoromethyl group or pentafluoroethyl group, and the trifluoromethyl group is preferable. m is an integer of 0 to 3, n is an integer of 1 to 4, and the sum of n and m indicates a valence of R and is an integer of 2 to 4. a is 1, b represents an integer of 2 to 25, and c represents an integer of 0 to 10. Preferably, b represents an integer of 4 to 20, and c represents an integer of 0 to 1. Further, constitutional units in the above structures do not define the order of them, and may be bonded in a block or random manner. Production of surfactants based on partially fluorinated oxetane ring-opening polymers, is detailed in U.S. Pat. No. 5,650,483. Desirable among them are, FC-4430, SURFLON S-381, SURFINOL E1004, KH-20, KH-30, and the oxetane ring-opening polymers represented by the structural formula. These can be used solely, or mixedly in two or more kinds.

The addition amount of the surfactant in the chemically amplified resist composition of the present invention, is 2 parts by mass or less, and preferably 1 part by mass or less, relative to 100 parts by mass of the base resin (A).

In the present invention, even when the chemically amplified positive resist thin film with the film thickness of 10 to 100 nm is formed by using the chemically amplified positive resist composition explained above, an improvement in LER and a high resolution can be realized.

Meanwhile, formation of the resist film with the film thickness of 10 to 100 nm on the substrate to be processed by using the chemically amplified positive resist composition of the present invention is done via a step of spin coating of the resist composition onto the substrate to be processed and a step of pre-baking thereafter, wherein any of these steps is carried out by a heretofore known method.

Although there are several known coating methods other than the spin coating method, when a thin film with the resist film thickness of 10 to 100 nm, like the one in this invention, is formed, a spin coating method is used to obtain a uniform film thickness.

In the case that the substrate to be processed is a semiconductor wafer, the coating conditions at the time of spin coating need to be controlled according to the wafer size, an intended film thickness, a composition of the resist composition, and the like. When the film thickness of about 100 nm is intended to be obtained by using an 8-inch wafer, the resist film with a high uniformity can be obtained by rotation with a rotation speed of 4,000 to 5,000 revolutions/minute with a time of 40 seconds, after the resist composition is cast on the wafer.

In the case that the substrate to be processed is a semiconductor wafer, the amount of the solvent to be used in the chemically amplified positive resist composition of the present invention to form the chemically amplified resist film having the film thickness of 10 to 100 nm is 1,400 to 1,600 parts by mass relative to 100 parts by mass of the base resin. Then, a pre-bake is done in order to remove an excess solvent remained in the resist film formed by using the chemically amplified positive resist composition having a solid component concentration controlled as mentioned above. The conditions of the pre-bake are; the temperature of 80 to 130° C. and the time of 1 to 10 minutes usually, and 90 to 110° C. and 3 to 5 minutes more preferably, when the pre-bake is done on a hot plate.

In the case that the substrate to be processed is a photomask blank, by the same token, the coating conditions need to be controlled according to the blank size, an intended film thickness, a composition of the resist composition, and the like. When the film thickness of about 100 nm is intended on a square blank of 15.2×15.2 cm, the resist film with a high uniformity can be obtained, after the resist composition is cast on the blank, by rotation with a rotation speed of 1,000 to 3,000 revolutions/minute for 2 seconds, and then at the rotation of 800 or less revolutions/minute for 30 seconds.

In the case that the substrate to be processed is a photomask blank, the amount of the solvent to be used in the chemically amplified positive resist composition of the present invention to form the chemically amplified resist film having the film thickness of 10 to 100 nm is 2,000 to 9,700 parts by mass relative to 100 parts by mass of the base resin.

Then, a pre-bake is done in order to remove an excess solvent remained in the resist film formed by using the chemically amplified positive resist composition having this solid component concentration controlled by the solvent. The conditions of the pre-bake are; the temperature of 80 to 130° C. and the time of 4 to 20 minutes usually, and 90 to 110° C. and 8 to 12 minutes more preferably, when the pre-bake is done on a hot plate.

Subsequently, the chemically amplified resist film thus obtained is subjected to a pattern exposure to form an intended pattern. The exposure is done, in the case of a semiconductor processing, by covering above the foregoing resist film with a mask to form an intended pattern and using a high energy beam, such as a far-infrared ray, an excimer laser, and an X-ray, or an electron beam, with the exposure amount of 1 to 100 $\mu C/cm^2$ and more preferably 10 to 100 $\mu C/cm^2$. In addition to an ordinary exposure method, the exposure can also be done by an immersion method wherein the space between a projection lens and the resist is immersed in a liquid as appropriate.

In the case of processing a photomask blank, a pattern exposure is usually done by a beam exposure because many of the identical products are not intended to be made by the processing. A high energy beam of an electron beam is generally used, but the foregoing other beams can also be used as the light source by the same token.

After the exposure, a post exposure bake (PEB) is usually done, for example, on a hot plate at 60 to 150° C. for 4 to 20 minutes, preferably at 80 to 140° C. for 8 to 12 minutes, to carry out a chemical amplification reaction by diffusing the acid. Then, development is done to form an intended pattern on the substrate, by using an aqueous alkaline developer such as tetramethyl ammonium hydroxide (TMAH) with a concentration ranging from 0.1 to 5% by mass, preferably 2 to 3% by mass, with a time ranging from 0.1 to 3 minutes, preferably 0.5 to 2 minutes, and with an ordinary method such as a dip method, a puddle method, and a spray method. In addition, a heat treatment (thermal flow) may be done further, as appropriate, after the development to adjust the pattern size. Incidentally, the chemically amplified positive resist composition of the present invention is most suitably used for fine patterning by a high energy beam, in particular, a far-ultraviolet beam or an excimer laser with the wavelength of 250 to 120 nm, an extreme ultraviolet beam, an X-ray, and an electron beam.

As to the substrate to be processed for a lithography targeted by the chemically amplified positive resist composition of the present invention, any substrate such as, for example, a semiconductor wafer, an intermediate substrate in the semiconductor manufacturing, and a photomask substrate, can be used as far as it uses a lithography by a photoresist, though a substrate having a film formed of a metal compound by a spattering and the like can realize the effects of the present invention advantageously. Especially in a photomask blank formed of a chromium compound film on the outermost surface as a light-shielding film or an etching mask film, a profile control of a resist pattern at the substrate surface is so difficult that the effects of the present invention are particularly obtained. Examples of the chromium compound in the substrate's outermost surface material usefully applied by the forgoing present invention include a metal chromium, chromium oxide, chromium nitride, chromium carbide, chromium oxynitride, chromium oxycarbide, chromium carbonitride, and chromium oxycarbonitride.

EXAMPLES

Hereinafter, the present invention will be described specifically by Examples and Comparative Examples, but the present invention is not limited by these descriptions.

Structural formulae of the base resins (Polymer-1 to Polymer-5, Comparative Polymer-1) of the chemically amplified positive resist composition used in Examples and Comparative Example are shown below. In the below examples, Mw and Mn are polystyrene-equivalent values measured by a gel permeation chromatography (GPC).

Polymer-1

Polymer-1 is shown by the following general formula (1), wherein $R_1$ is an ethyl group; each $R_2$ and $R_3$ is a methyl group; p=0.7 and q=0.3; and Mw=12,000 (Mw/Mn=1.7).

Polymer-2

Polymer-2 is shown by the following general formula (1), wherein $R_1$ is an ethyl group; each $R_2$ and $R_3$ is a methyl group; p=0.6 and q=0.4; and Mw=10,000 (Mw/Mn=1.7).

(1)

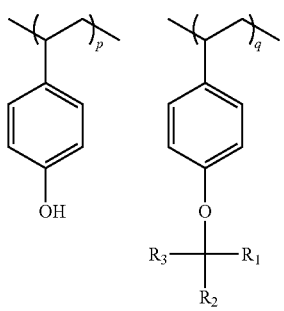

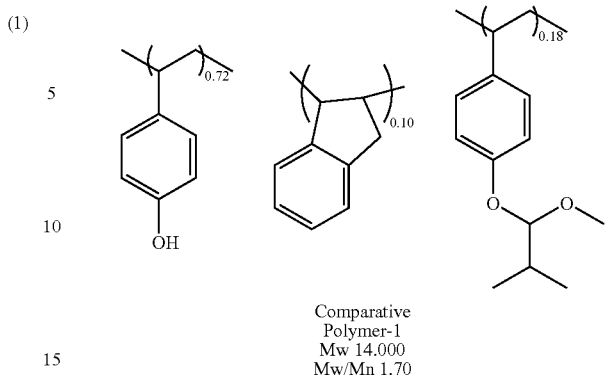

Comparative
Polymer-1
Mw 14,000
Mw/Mn 1.70

Polymer-3

Polymer-3 is shown by the following general formula (2), wherein $R_1$ is an ethyl group; each $R_2$ and $R_3$ is a methyl group; p=0.6, r1=0.1, and q=0.3; and Mw=8,000 (Mw/Mn=1.7).

(2)

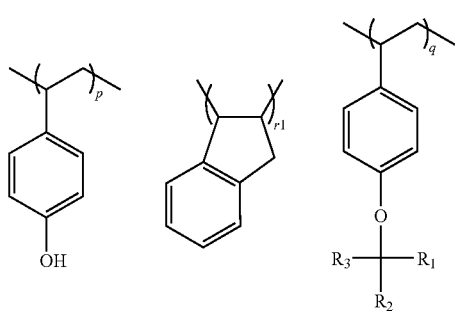

Polymer-4

Polymer-4 is shown by the following general formula (3), wherein $R_1$ is an ethyl group; each $R_2$ and $R_3$ is a methyl group; p=0.6, r2=0.1, and q=0.3; and Mw=8,000 (Mw/Mn=1.7).

(3)

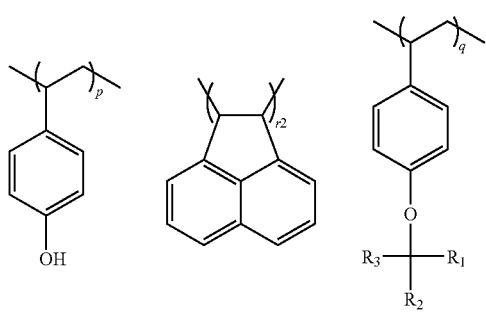

Polymer-5

Polymer-5 is shown by the above general formula (1), wherein each $R_1$, $R_2$, and $R_3$ is a methyl group; p=0.7 and q=0.3; and Mw=12,000 (Mw/Mn=1.7).

Comparative Polymer-1

Comparative Polymer-1 is shown by the following general formula.

Structure formulae of the acid generators (PAG-1 to PAG-11) used in the following description are shown below.

PAG-1 is shown by the following general formula (4), wherein $R_4$ is a tert-butoxy group; each $R_5$ and $R_6$ is a hydrogen atom; $R_8$ is a methyl group; and each $R_7$ and $R_9$ is a hydrogen atom.

PAG-2 is shown by the following general formula (4), wherein $R_4$ is a tert-butoxy group; each $R_5$ and RF is a hydrogen atom; and each $R_7$, $R_8$, and $R_9$ is a methyl group.

PAG-3 is shown by the following general formula (4), wherein $R_4$ is a tert-butoxy group; each $R_5$ and $R_6$ is a hydrogen atom; and each $R_7$, $R_8$, and $R_9$ is an isopropyl group.

PAG-4 is shown by the following general formula (4), wherein each $R_4$ and $R_5$ is a tert-butoxy group; $R_6$ is a hydrogen atom; $R_8$ is a methyl group; and each $R_7$ and $R_9$ is a hydrogen atom.

PAG-5 is shown by the following general formula (4), wherein each $R_4$ and $R_5$ is a tert-butoxy group; $R_6$ is a hydrogen atom; and each $R_7$, $R_8$, and $R_9$ is a methyl group.

PAG-6 is shown by the following general formula (4), wherein each $R_4$ and $R_5$ is a tert-butoxy group; $R_6$ is a hydrogen atom; and each $R_7$, $R_8$, and $R_9$ is an isopropyl group.

PAG-7 is shown by the following general formula (4), wherein each $R_4$, $R_5$, and $R_6$ is a tert-butoxy group; $R_8$ is a methyl group; and each $R_7$ and $R_9$ is a hydrogen atom.

PAG-8 is shown by the following general formula (4), wherein each $R_4$, $R_5$, and $R_6$ is a tert-butoxy group; and $R_7$, $R_8$, and $R_9$ is a methyl group.

PAG-9 is shown by the following general formula (4), wherein each $R_4$, $R_5$, $R_6$ is a tert-butoxy group; and each $R_7$, $R_8$, and $R_9$ is an isopropyl group.

(4)

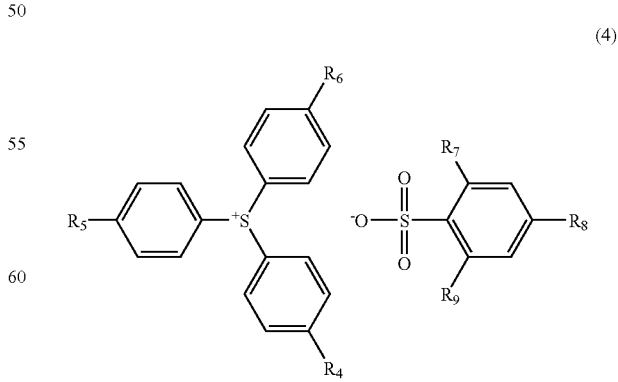

PAG-10 is triphenyl sulfonium camphor sulfonate.
PAG-11 is triphenyl sulfonium adamantane sulfonate.

The organic solvents used in Examples and Comparative Examples are shown below.
Solvent (A): propyleneglycol methyl ether acetate (PGMEA)
Solvent (B): ethyl lactate (EL)
Solvent (C): propyleneglycol monomethyl ether (PGME)

The amine compounds or the amine oxide compounds each having a carboxyl group but not having a hydrogen atom covalently bonded to a nitrogen atom as a basic center and the basic component not containing a carboxyl group (Quencher), and Surfactant A, used in Examples and Comparative Examples are following compounds.
Quencher-1: m-dimethylaminobenzoic acid
Quencher-2: p-diethylaminobenzoic acid
Quencher-3: p-dibutylaminobenzoic acid
Quencher-4: oxide of m-dimethylaminobenzoic acid
Quencher-5: oxide of p-diethylaminobenzoic acid
Quencher-6: oxide of p-dibutylaminobenzoic acid
Quencher-7: 4-(dimethylamino)phenylacetic acid
Quencher-8: 1-piperidine propionic acid
Quencher-9: tris(2-(methoxymethoxy)ethyl)amine*
Quencher-10: oxide of tris(2-(methoxymethoxy)ethyl)amine*
Quencher-11: 3-(dimethylamino)-5,5'-dimethyl-2-cyclohexene-1-one*
Quencher-12: N-2-(acetoxy)ethyl imidazole*
Quencher-13: tetrabutyl ammonium acetate*
Quencher-14: 2-(4-morpholinyl)ethyl octanoate ester*
Quencher-15: benzoate of 1H-benzoimidazole-1-ethanol (ester)*
* These compounds are the basic components not having a carboxyl group.
Surfactant A: FC-4430 (manufactured by 3M Company)

Examples 1 to 8, and Comparative Examples 1 and 2

A base resin, an acid generator, a basic component, an organic solvent, and a surfactant were blended in the ratio shown in Table 1, and the resulting mixture was filtered through a 0.04-μm filter made of a nylon resin to obtain each solution of the chemically amplified positive resist composition.

This solution of the chemically amplified positive resist composition was applied on a square mask blank with 152 mm on a side whose outermost surface is formed of a chromium oxynitride film at the rotation speed of 1,700 revolutions/minute by a spin coating method to obtain the thickness of 90 nm. Then, this mask blank was baked on a hot plate at 90° C. for 10 minutes.

The film thickness was measures with an optical measurement instrument NanoSpec (manufactured by Nanometrics Inc.). The measurements were made on 81 spots in the plane of the blank substrate except for a peripheral area within 10 mm from the blank periphery to obtain the average film thickness and the film thickness range.

Then, the exposure was made with an electron beam exposure instrument EBM 5000 (manufactured by NuFlare Technology, Inc., acceleration voltage of 50 keV), which was followed by the post-exposure bake (PEB) at 90° C. for 10 minutes and then development in a 2.38% aqueous tetramethyl ammonium hydroxide solution to obtain a positive pattern (Examples 1 to 8, and Comparative Examples 1 and 2).

The resist patterns thus obtained were evaluated as follows.

The exposure amount at which a top and a bottom of the 200-nm line-and-space was resolved with 1:1 was taken as the optimum exposure amount (sensitivity: Eop), and the minimum line width of a separated line-and-space at this exposure amount was taken as the resolution of the resist to be evaluated. A resist cross section of the resolved resist pattern profile was observed with regard to especially whether or not a footing occurred at the substrate surface by using a scanning electron microscope. As to the line edge roughness, 3σ was calculated from the 50 point measurements (by S-8840, manufactured by Hitachi Ltd.) at 5 μm longitudinal direction of the 100-nm line pattern. It can be seen that performance is better when the value is smaller.

Evaluation results of the resolution, the pattern's cross section profile, and the line edge roughness are shown in Table 2.

TABLE 1

| Composition (parts by mass) | Ex. 1 | Ex. 2 | Ex. 3 | Ex. 4 | Ex. 5 | Ex. 6 | Ex. 7 | Ex. 8 | Com. Ex. 1 | Com. Ex. 2 |
|---|---|---|---|---|---|---|---|---|---|---|
| polymer-1 | 80 | 80 | 80 | 80 | 80 | 80 | 80 | 80 | | |
| Comparative polymer-1 | | | | | | | | | 80 | 80 |
| PAG-1 | 8 | | | | | | | | 8 | |
| PAG-2 | | 8 | | | | | | | | |
| PAG-3 | | | 8 | | | | | | | |
| PAG-4 | | | | 8 | | | | | | |
| PAG-5 | | | | | 8 | | | | | |
| PAG-6 | | | | | | 8 | | | | |
| PAG-10 | | | | | | | 8 | | | 8 |
| PAG-11 | | | | | | | | 8 | | |
| Quencher-8 | 0.2 | 0.2 | 0.2 | 0.2 | 0.2 | 0.2 | 0.2 | 0.2 | 0.2 | 0.2 |
| Surfactant A | 0.07 | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 | 800 |
| Solvent (B) | 800 | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 | 1,000 |

TABLE 2

| | resolution (μm) | Pattern's cross section profile | Line edge roughness (nm) |
|---|---|---|---|
| Example 1 | 0.04 | Good | 3 |
| Example 2 | 0.04 | Good | 3 |
| Example 3 | 0.04 | Good | 3 |
| Example 4 | 0.04 | Good | 3 |
| Example 5 | 0.04 | Good | 3 |
| Example 6 | 0.04 | Good | 3 |
| Example 7 | 0.045 | Rounding profile | 3 |
| Example 8 | 0.045 | Rounding profile | 3 |
| Comparative Example 1 | 0.05 | T-top | 5 |

TABLE 2-continued

| | resolution (μm) | Pattern's cross section profile | Line edge roughness (nm) |
|---|---|---|---|
| Comparative Example 2 | 0.05 | Rounding profile | 5 |

There was no problem of the footing in the pattern's cross section profile of Comparative Polymer-1 (Comparative Examples 1 and 2) in which the acid labile group of the base resin was an acetal group, but Comparative Example 1 gave a T-top form, or so-called a prominent head form, and Comparative Example 2 gave a pattern with a round head form (rounding profile). In addition, the line edge roughness of Comparative Examples 1 and 2 was poorer than that of Examples 1 to 8 in which Polymer-1 having the acid labile group of a tertiary alkyl group was used as the base resin. On the other hand, when Polymer-1 was used as the base resin (Examples 1 to 8), good pattern profile without footing were obtained as a whole, though Examples 7 and 8 gave patterns with a round head form.

Example 7 in which an acid generator of triphenyl sulfonium camphor sulfonate (PAG-10) was used and Example 8 in which an acid generator of triphenyl sulfonium adamantane sulfonate (PAG-11) was used showed approximately the same performance as Examples 1 to 6, and could give a resolution below 50 nm, or 0.045 μm, though the resolution was somewhat poor because of a low reaction contrast.

Example 9 to Example 17, and Comparative Example 3

A base resin, an acid generator, a basic component, an organic solvent, and a surfactant were blended in the ratio shown in Table 3 in a similar manner to that in the foregoing to obtain each solution of the chemically amplified positive resist composition, which was then subjected to the pattern formation. The resolution, the pattern profile, and the line edge roughness of the formed pattern were evaluated in a similar manner to that in the foregoing. The results are shown in Table 4.

TABLE 3

| Composition (parts by mass) | Ex. 9 | Ex. 10 | Ex. 11 | Ex. 12 | Ex. 13 | Ex. 14 | Ex. 15 | Ex. 16 | Ex. 17 | Com. Ex. 3 |
|---|---|---|---|---|---|---|---|---|---|---|
| polymer-1 | 80 | 80 | 80 | 80 | 80 | 80 | 80 | 80 | 80 | |
| Comparative polymer-1 | | | | | | | | | | 80 |
| PAG-7 | 8 | | | | | | | | 8 | 8 |
| PAG-8 | | 8 | | | | | | | | |
| PAG-9 | | | 8 | | | | | | | |
| PAG-1 | | | | 4 | | | | | | |
| PAG-2 | | | | 4 | 4 | 4 | 4 | 4 | | |
| PAG-3 | | | | | 4 | | | | | |
| PAG-4 | | | | | | 4 | | | | |
| PAG-5 | | | | | | | 4 | | | |
| PAG-6 | | | | | | | | 4 | | |
| Quencher-8 | 0.2 | 0.2 | 0.2 | 0.2 | 0.2 | 0.2 | 0.2 | 0.2 | | |
| Quencher-10 | | | | | | | | | 0.2 | 0.2 |
| Surfactant A | 0.07 | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 | 800 |
| Solvent (B) | 800 | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 | 1,000 |

TABLE 4

| | resolution (μm) | Pattern's cross section profile | Line edge roughness (nm) |
|---|---|---|---|
| Example 9 | 0.04 | Good | 3 |
| Example 10 | 0.04 | Good | 3 |
| Example 11 | 0.04 | Good | 3 |
| Example 12 | 0.04 | Good | 3 |
| Example 13 | 0.04 | Good | 3 |
| Example 14 | 0.04 | Good | 3 |
| Example 15 | 0.04 | Good | 3 |
| Example 16 | 0.04 | Good | 3 |
| Example 17 | 0.045 | Slightly footing | 3 |
| Comparative Example 3 | 0.05 | T-top footing | 5 |

Examples 9 to 16 in which the acid labile group of the base resin was a tertiary alkyl group gave a good resolution (0.04 μm), a good pattern profile without footing, and a good line edge roughness (3 nm). In Example 17, Polymer-1 in which the acid labile group of the base resin was a tertiary alkyl group and the basic component of an amine compound not having a carboxyl group were used. In this case, footing was slightly observed but it was within an allowable range. In Comparative Example 3, good results could not be obtained in its cross section profile, resolution, and line edge roughness.

Example 18 to Example 27

A base resin having a repeating unit whose phenolic hydroxy group was protected by a tertiary alkyl group as the base resin (A), PAG 2 as the acid generator (B) generating an acid by an energy beam exposure, and an amine compound or an amine oxide compound each having a carboxyl group but not having a hydrogen atom covalently bonded to a nitrogen atom as a basic center as the basic component (C) were blended in the ratio shown in the following Table 5 to obtain each solution of the chemically amplified positive resist composition of the present invention in a similar manner to that in the foregoing. The resolution, the pattern profile, and the line edge roughness of the pattern formed by using the composition were evaluated.

Example 27, in which Polymer-5 was used as the base resin, also gave a good pattern profile, resolution, and line edge roughness, as in the cases of Polymer-1. Example 26, in which two kinds of amine compounds each having carboxyl group and not having a hydrogen atom covalently bonded to a nitrogen atom as a basic center was used, also gave good results.

Example 28 to Example 36

A base resin having a repeating unit whose phenolic hydroxy group is protected by a tertiary alkyl group as the base resin (A), PAG 2 as the acid generator (B) generating an acid by an energy beam exposure, and an amine compound or an amine oxide compound each having a carboxyl group but not having a hydrogen atom covalently bonded to the nitrogen atom which plays a central role as the base (Quenchers-2, 3, and 8) and an amine compound not having a carboxyl group (Quenchers-9 to 15) as the basic component (C) were blended in the ratio shown in the following Table 6 to obtain each solution of the chemically amplified positive resist composition of the present invention in a similar manner to that in the foregoing. The resolution, the pattern profile, and the line edge roughness of the pattern formed by using the composition were evaluated.

TABLE 5

| Composition (parts by mass) | Ex. 18 | Ex. 19 | Ex. 20 | Ex. 21 | Ex. 22 | Ex. 23 | Ex. 24 | Ex. 25 | Ex. 26 | Ex. 27 |
|---|---|---|---|---|---|---|---|---|---|---|
| polymer-1 | 80 | 80 | 80 | 80 | 80 | 80 | 80 | 80 | 80 | |
| Polymer-5 | | | | | | | | | | 80 |
| PAG-2 | 8 | 8 | 8 | 8 | 8 | 8 | 8 | 8 | 8 | 8 |
| Quencher-1 | 0.2 | | | | | | | | | |
| Quencher-2 | | 0.2 | | | | | | | | |
| Quencher-3 | | | 0.2 | | | | | | 0.1 | |
| Quencher-4 | | | | 0.2 | | | | | | |
| Quencher-5 | | | | | 0.2 | | | | | |
| Quencher-6 | | | | | | 0.2 | | | | |
| Quencher-7 | | | | | | | 0.2 | | | |
| Quencher-8 | | | | | | | | 0.2 | 0.1 | 0.2 |
| Surfactant A | 0.07 | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 | 800 |
| Solvent (B) | 800 | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 | 1,000 |

In any Example, a good resolution (resolution of 0.04 μm), a good pattern profile without footing, and a good line edge roughness (3 nm) were obtained.

TABLE 6

| Composition (parts by mass) | Ex. 28 | Ex. 29 | Ex. 30 | Ex. 31 | Ex. 32 | Ex. 33 | Ex. 34 | Ex. 35 | Ex. 36 |
|---|---|---|---|---|---|---|---|---|---|
| polymer-1 | 80 | 80 | 80 | 80 | 80 | 80 | 80 | 80 | 80 |
| PAG-2 | 8 | 8 | 8 | 8 | 8 | 8 | 8 | 8 | 8 |
| Quencher-2 | | | | | | | | 0.1 | |
| Quencher-3 | | | | | | | | | 0.1 |
| Quencher-8 | 0.1 | 0.1 | 0.1 | 0.1 | 0.1 | 0.1 | 0.1 | | |
| Quencher-9 | 0.1 | | | | | | | | |
| Quencher-10 | | 0.1 | | | | | | 0.1 | 0.1 |
| Quencher-11 | | | 0.1 | | | | | | |
| Quencher-12 | | | | 0.1 | | | | | |
| Quencher-13 | | | | | 0.1 | | | | |
| Quencher-14 | | | | | | 0.1 | | | |
| Quencher-15 | | | | | | | 0.1 | | |

TABLE 6-continued

| Composition (parts by mass) | Ex. 28 | Ex. 29 | Ex. 30 | Ex. 31 | Ex. 32 | Ex. 33 | Ex. 34 | Ex. 35 | Ex. 36 |
|---|---|---|---|---|---|---|---|---|---|
| Surfactant A | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 |
| Solvent (B) | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 |

In any Example, a good resolution (resolution of 0.04 μm), a good pattern profile without footing, and a good line edge roughness (3 nm) were obtained.

Example 37 to Example 45

A base resin having a repeating unit whose phenolic hydroxy group is protected by a tertiary alkyl group as the base resin (A), PAG 2 as the acid generator (B) generating an acid by an energy beam exposure, and an amine compound or an amine oxide compound each having a carboxyl group but not having a hydrogen atom covalently bonded to a nitrogen atom as a basic center (Quenchers-2, 3, and 8) and an amine compound not having a carboxyl group (Quenchers-9 to 13) as the basic component (C) were blended in the ratio shown in the following Table 7 to obtain each solution of the chemically amplified positive resist composition of the present invention in a similar manner to that in the foregoing. The resolution, the pattern profile, and the line edge roughness of the pattern formed by using the composition were evaluated. The results are shown in Table 8.

TABLE 7

| Composition (parts by mass) | Ex. 37 | Ex. 38 | Ex. 39 | Ex. 40 | Ex. 41 | Ex. 42 | Ex. 43 | Ex. 44 | Ex. 45 |
|---|---|---|---|---|---|---|---|---|---|
| polymer-1 | 80 | 80 | 80 | 80 | 80 | 80 | 80 | 80 | 80 |
| PAG-2 | 8 | 8 | 8 | 8 | 8 | 8 | 8 | 8 | 8 |
| Quencher-2 | | | | | | 0.4 | | 0.2 | |
| Quencher-3 | | | | | | | 0.4 | | 0.2 |
| Quencher-8 | 0.4 | 0.2 | 0.2 | 0.2 | 0.2 | | | | |
| Quencher-9 | | | | | | | | 0.2 | 0.2 |
| Quencher-10 | | 0.2 | | | | | | | |
| Quencher-11 | | | 0.2 | | | | | | |
| Quencher-12 | | | | 0.2 | | | | | |
| Quencher-13 | | | | | 0.2 | | | | |
| Surfactant A | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 |
| Solvent (B) | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 |

TABLE 8

| | resolution (μm) | Pattern's cross section profile | Line edge roughness (nm) |
|---|---|---|---|
| Example 37 | 0.03 | Good | 2 |
| Example 38 | 0.03 | Good | 2 |
| Example 39 | 0.03 | Good | 2 |
| Example 40 | 0.03 | Good | 2 |
| Example 41 | 0.03 | Good | 2 |
| Example 42 | 0.04 | Good | 3 |
| Example 43 | 0.04 | Good | 3 |
| Example 44 | 0.03 | Good | 2 |
| Example 45 | 0.03 | Good | 2 |

When an amount of the amine compound as the basic component (C) is increased, the sensitivity is decreased but the resolution and the line edge roughness are improved. However, in some of the amine compounds or the amine oxide compounds each having a carboxyl group but not having a hydrogen atom covalently bonded to a nitrogen atom as a basic center, only the sensitivity is decreased but the resolution is not improved even though the amount is increased (Examples 42 and 43). However, when mixed with the amine compound not having a carboxyl group, the resolution is improved (Examples 44 and 45), and thus it can be seen that control of the sensitivity by mixing with the amine compound not having a carboxyl group is effective.

It is assumed that, in some of the amine compounds or the amine oxide compounds having a carboxyl group but not having a hydrogen atom covalently bonded to a nitrogen atom as a basic center, when its amount is increased, the pattern is susceptible to be swollen at the time of development due to its hydrophilicity, and thus the resolution is not improved even though the sensitivity is decreased.

Example 46 to Example 54

A base resin (Polymers 2 to 4) having a repeating unit whose phenolic hydroxy group is protected by a tertiary alkyl group as the base resin (A), PAG 2 as the acid generator (B)

generating an acid by an energy beam exposure, and an amine compound having a carboxyl group but not having a hydrogen atom covalently bonded to a nitrogen atom as a basic center (Quencher-8) and an amine compound not having a carboxyl group (Quenchers-9 to 13) as the basic component (C) were blended in the ratio shown in the following Table 9 to obtain each solution of the chemically amplified positive resist composition of the present invention in a similar manner to that in the foregoing. The resolution, the pattern profile, and the line edge roughness of the pattern formed by using the composition were evaluated. The results are shown in Table 10.

In any of the cases when Polymer-2 having less amount of polyhydroxy styrene than Polymer 1 was used (Example 46), when Polymer-3 having an introduced indene was used (Example 47), and when Polymer-4 having an introduced acenaphthylene was used (Example 48), the pattern profile tended to have a slightly prominent head as compared with Example 2 but was within an allowable range.

In Example 49 to Example 54, when Polymer-2 was used as the base resin (A), and an amount of the amine was increased by blending the amine compound or an amine oxide compound each having a carboxyl group but not having a hydrogen atom covalently bonded to a nitrogen atom as a

TABLE 9

| Composition (parts by mass) | Ex. 46 | Ex. 47 | Ex. 48 | Ex. 49 | Ex. 50 | Ex. 51 | Ex. 52 | Ex. 53 | Ex. 54 |
|---|---|---|---|---|---|---|---|---|---|
| polymer-2 | 80 | | | 80 | 80 | 80 | 80 | 80 | 80 |
| Polymer-3 | | 80 | | | | | | | |
| Polymer-4 | | | 80 | | | | | | |
| PAG-2 | 8 | 8 | 8 | 8 | 8 | 8 | 8 | 8 | 8 |
| Quencher-8 | 0.2 | 0.2 | 0.2 | 0.2 | 0.2 | 0.2 | 0.2 | 0.2 | 0.2 |
| Quencher-9 | | | | 0.2 | | | | | |
| Quencher-10 | | | | | 0.2 | 0.4 | | | |
| Quencher-11 | | | | | | | 0.2 | | |
| Quencher-12 | | | | | | | | 0.2 | |
| Quencher-13 | | | | | | | | | 0.2 |
| Surfactant A | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 |
| Solvent (B) | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 |

TABLE 10

| | resolution (μm) | Pattern's cross section profile | Line edge roughness (nm) |
|---|---|---|---|
| Example 46 | 0.04 | Good | 3 |
| Example 47 | 0.04 | Good | 3 |
| Example 48 | 0.04 | Good | 3 |
| Example 49 | 0.03 | Good | 2 |
| Example 50 | 0.03 | Good | 2 |
| Example 51 | 0.025 | Slightly rounding profile | 1 |
| Example 52 | 0.03 | Good | 2 |
| Example 53 | 0.03 | Good | 2 |
| Example 54 | 0.03 | Good | 2 |

In any Example, a good resolution (resolution of about ~0.04 μm), a good pattern profile without footing, and a good line edge roughness (about ~3 nm) were obtained.

basic center with the amine compound not having a carboxyl group as the basic component (C), the resolution was improved. Especially when the total amount of the amine was made 0.6 (Example 51), the resolution with the minimum line width of 0.025 μm and the line edge roughness of 1 nm could be obtained.

Example 55 to Example 63

A base resin (Polymer 1) having a repeating unit whose phenolic hydroxy group is protected by a tertiary alkyl group as the base resin (A), PAG-2, 5, and 8 as the acid generator (B) generating an acid by an energy beam exposure, an amine compound or an amine oxide compound having a carboxyl group but not having a hydrogen atom covalently bonded to a nitrogen atom as a basic center (Quencher-8) as the basic component (C), and an organic solvent were blended in the ratio shown in the following Table 11 to obtain each solution of the chemically amplified positive resist composition of the present invention in a similar manner to that in the foregoing. The resolution, the pattern profile, and the line edge roughness of the pattern formed by using the composition were evaluated. The results are shown in Table 12.

TABLE 11

| Composition (parts by mass) | Ex. 55 | Ex. 56 | Ex. 57 | Ex. 58 | Ex. 59 | Ex. 60 | Ex. 61 | Ex. 62 | Ex. 63 |
|---|---|---|---|---|---|---|---|---|---|
| polymer-1 Molecular weight: 10,000 | 80 | | | | 80 | | | | |

TABLE 11-continued

| Composition (parts by mass) | Ex. 55 | Ex. 56 | Ex. 57 | Ex. 58 | Ex. 59 | Ex. 60 | Ex. 61 | Ex. 62 | Ex. 63 |
|---|---|---|---|---|---|---|---|---|---|
| polymer-1 Molecular weight: 8,000 | | 80 | | | | 80 | | | |
| polymer-1 Molecular weight: 6,000 | | | 80 | | | | 80 | | |
| polymer-1 Molecular weight: 4,000 | | | | 80 | | | | 80 | 80 |
| PAG-2 | 8 | 8 | 8 | 8 | | | | | |
| PAG-5 | | | | | 8 | 8 | 8 | 8 | |
| PAG-8 | | | | | | | | | 8 |
| Quencher-8 | 0.2 | 0.2 | 0.2 | 0.2 | 0.2 | 0.2 | 0.2 | 0.2 | 0.2 |
| Surfactant A | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 |
| Solvent (B) | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 |

TABLE 12

| | resolution (μm) | Pattern's cross section profile | Line edge roughness (nm) |
|---|---|---|---|
| Example 55 | 0.04 | Good | 3 |
| Example 56 | 0.04 | Good | 3 |
| Example 57 | 0.04 | Good | 3 |
| Example 58 | 0.045 | Rounding profile | 4 |
| Example 59 | 0.04 | Good | 3 |
| Example 60 | 0.04 | Good | 3 |
| Example 61 | 0.04 | Good | 3 |
| Example 62 | 0.04 | Good | 3 |
| Example 63 | 0.04 | Good | 3 |

When the molecular weight of Polymer-1 was changed to 10,000 (Examples 55 and 59), 8,000 (Examples 56 and 60), 6,000 (Examples 57 and 61), and 4,000 (Examples 58, 62, and 63), any example of Polymer-1 with the molecular weights of 10,000, 8,000, and 6,000 gave a good resolution (resolution of 0.04 μm), a good pattern profile without footing, and a good line edge roughness (3 nm). However, in Example 58 in which the molecular weight of 4,000 was used, deterioration of LER could be suppressed to 4 nm, but the pattern with a round head and the resolution of 0.045 μm were resulted after development. When PAG-5 having the tertiary butoxy groups introduced in two benzene rings of a cation was used (Example 62), the resolution of 0.04 μm could be accomplished even with the molecular weight of 4,000 because the dissolution inhibition effect in the unexposed part is large. When PAG-8 having the tertiary butoxy groups introduced in three benzene rings of a cation was used (Example 63), the dissolution inhibition effect in the unexposed part became too large thereby tending to form a slightly prominent head pattern though it was within an allowable range.

Example 64 to Example 72

A base resin (Polymer 1) having a repeating unit whose phenolic hydroxy group is protected by a tertiary alkyl group as the base resin (A), PAG 2 as the acid generator (B) generating an acid by an energy beam exposure, an amine compound or an amine oxide compound each having a carboxyl group but not having a hydrogen atom covalently bonded to a nitrogen atom as a basic center (Quenchers-2, 3, and 8) and an amine compound not having a carboxyl group (Quenchers-9 to 15) as the basic component (C), Surfactant B, and an organic solvent were blended in the ratio shown in the following Table 13 to obtain each solution of the chemically amplified positive resist composition of the present invention in a similar manner to that in the foregoing. The resolution, the pattern form, and the line edge roughness of the pattern formed by using the composition were evaluated.

Here, the used Surfactant B (RF-636) has the following structure: copolymer of 3-methyl-3-(2,2,2-trifluoroethoxymethyl)oxetane, tetrahydrofurane, and 2,2-dimethyl-1,3-propanediol (manufactured by Omnova Solutions, Inc.), with the weight-average molecular weight of 1,500 and a':(b'+b"):(c'+c")=1:4 to 7:0.01 to (mol ratio).

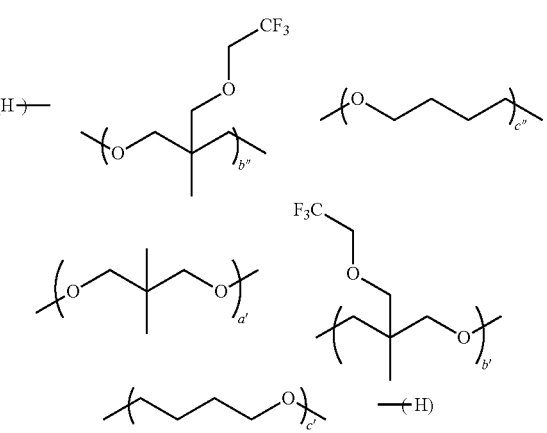

TABLE 13

| Composition (parts by mass) | Ex. 64 | Ex. 65 | Ex. 66 | Ex. 67 | Ex. 68 | Ex. 69 | Ex. 70 | Ex. 71 | Ex. 72 |
|---|---|---|---|---|---|---|---|---|---|
| polymer-1 | 80 | 80 | 80 | 80 | 80 | 80 | 80 | 80 | 80 |
| PAG-2 | 8 | 8 | 8 | 8 | 8 | 8 | 8 | 8 | 8 |
| Quencher-2 | | | | | | | | 0.1 | |
| Quencher-3 | | | | | | | | | 0.1 |
| Quencher-8 | 0.1 | 0.1 | 0.1 | 0.1 | 0.1 | 0.1 | 0.1 | | |
| Quencher-9 | 0.1 | | | | | | | 0.1 | 0.1 |
| Quencher-10 | | 0.1 | | | | | | | |
| Quencher-11 | | | 0.1 | | | | | | |
| Quencher-12 | | | | 0.1 | | | | | |
| Quencher-13 | | | | | 0.1 | | | | |
| Quencher-14 | | | | | | 0.1 | | | |
| Quencher-15 | | | | | | | 0.1 | | |
| Surfactant B | 0.07 | 0.07 | 0.07 | 0.07 | 0.07 | 0.07 | 0.07 | 0.07 | 0.07 |
| Solvent (A) | 800 | 800 | 800 | 800 | 800 | 800 | 800 | 800 | 800 |
| Solvent (B) | 800 | 800 | 800 | 800 | 800 | 800 | 800 | 800 | 800 |
| Solvent (C) | 1,000 | 1,000 | 1,000 | 1,000 | 1,000 | 1,000 | 1,000 | 1,000 | 1,000 |

In any Example, a good pattern profile with the resolution of 0.04 μm and the line edge roughness of 3 nm was formed, as in the cases of using Surfactant A.

Example 73 to Example 75

Solubility of the resist film by an acid generator (reaction contrast) was studied by the following method.

<Measurement of Film Loss after Addition of an Acid Generator and Development; PAG Addition in FIG. 1>

Film loss by development was measured on the chemically amplified resist film formed by using the chemically amplified positive resist composition containing Polymer-1 and an acid generator. Development was done by a puddle development by using an alkaline developer AD-10 (manufactured by Tama Chemicals Co., Ltd.) for 60 seconds. Here, the film loss is the difference in the film thickness before and after the development.

<Measurement of the Film Loss after Addition of an Acid Generator, Exposure, Heat-Treatment, and Development; After Exposure/PEB in FIG. 1>

The film loss was measured by the foregoing puddle-development on a heat-treated water-soluble top coat film (TARC) having an introduced acid on the resist film after its formation, as the simplified method for measurement of the film loss by development on the resist film which was obtained in a similar manner to that in the foregoing, exposed, and then subjected to the post-exposure bake (PEB). The difference of the resist film thickness between the resists with the formed TARC and without TARC is the film loss after exposure/PEB.

Here, the acid introduced to TARC is triisopropyl benzene sulfonic acid in the anionic part of the foregoing PAG-2. The film loss was measured on the resist composition prepared by using, as the acid generator, the foregoing PAG-3 and the following PAG-12 and 13, according to the prescription shown in Table 14. The change of the film loss is shown in FIG. 1.

PAG-12 is shown in the above general formula (4), wherein each $R_4$, $R_5$, $R_6$ is a hydrogen atom; and each $R_7$, $R_8$, and $R_9$ is an isopropyl group.

PAG-13 is shown in the above general formula (4), wherein $R_4$ is a tert-butyl group; each $R_5$ and $R_6$ is a hydrogen atom; and each $R_7$, $R_8$, and $R_9$ is an isopropyl group.

TABLE 14

| Composition (parts by mass) | Example 73 | Example 74 | Example 75 |
|---|---|---|---|
| Polymer-1 | 80 | 80 | 80 |
| PAG-3 | 8 | | |
| PAG-12 | | 8 | |
| PAG-13 | | | 8 |

It can be seen that PAG-3 shows a larger film loss after exposure/PEB and thus has a better reaction contrast, as compare with PAG-12 and PAG-13.

The present invention is not restricted to the foregoing embodiments. The foregoing embodiments are merely examples so that any embodiment composed of substantially the same technical concept as disclosed in the claims of the present invention and expressing a similar effect is included in the technical scope of the present invention.

What is claimed is:

1. A resist patterning process to form a resist pattern by a lithography, wherein a chemically amplified positive resist composition is applied on a photomask blank by a spin coating method to give a chemically amplified resist film having a film thickness of 10 to 100 nm, which is then exposed to a high energy beam and developed thereafter by using an alkaline developer, wherein the chemically amplified positive resist composition comprises at least:

(A) a base resin, insoluble or poorly soluble in an alkaline solution, having a repeating unit whose phenolic hydroxy group is protected by a tertiary alkyl group, wherein 95% or more by mol of the repeating unit composing the base resin (A) comprises combination of the repeating units represented by the following general formula (2) or (3), while soluble in an alkaline solution when the tertiary alkyl group is removed,

39

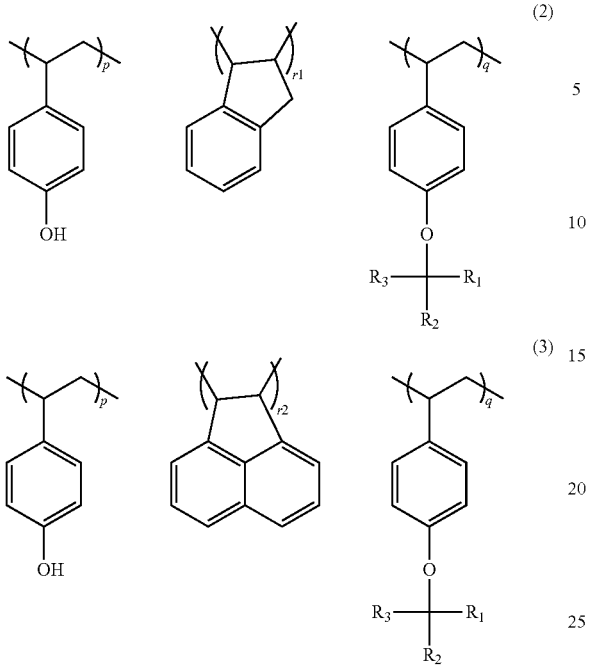

(2)

(3)

where
each of $R_1$, $R_2$, and $R_3$ in the general formulae (2) and (3) are selected from the group consisting of a methyl group, an ethyl group, a propyl group, an adamantyl group, a norbornyl group, a tetrahydrofurane-2-yl group, a 7-oxanorbornane-2-yl group, a cyclopentyl group, a 2-tetrahydrofuryl group, a tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$.1$^{7,10}$]dodecyl group, a tetracyclo[4.4.0.1$^{2,5}$.1$^{7,10}$]dodecyl group, and a 3-oxo-1-cyclohexyl group, and p, q, r1, and r2 represent a mol ratio of respective repeating units and are positive numbers:

(B) an acid generator containing at least one or more kinds of compounds represented by the following general formula (4),

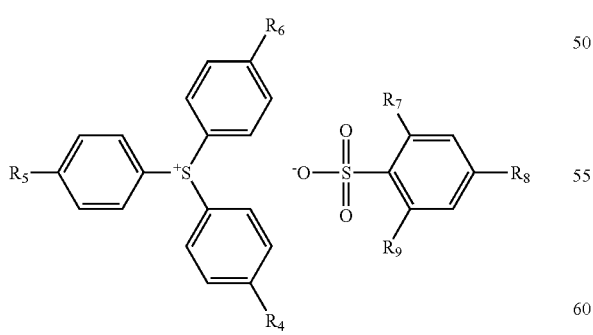

(4)

where
$R_4$, $R_5$, and $R_6$ represent a hydrogen atom or a tertiary alkyloxy group having 4 to 10 carbon atoms wherein all of $R_4$, $R_5$, and $R_6$ never are a hydrogen atom, and

40

$R_7$, $R_8$, and $R_9$ represent a hydrogen atom, a methyl group, an ethyl group, and an isopropyl group and may be the same or different;

(C) a basic component containing at least one or more kinds of compounds represented by the following general formulae (5) to (7),

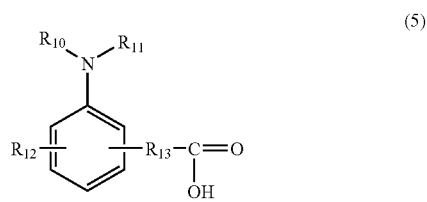

(5)

where
each $R_{10}$ and $R_{11}$ represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, or an alkyl thioalkyl group having 1 to 10 carbon atoms, $R_{10}$ and $R_{11}$ may form a ring structure by bonding with each other, $R_{12}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, an alkyl thioalkyl group having 1 to 10 carbon atoms, or a halogen group, and $R_{13}$ represents a single bond, a linear, a branched, or a cyclic alkylene group having 1 to 20 carbon atoms, or an arylene group having 6 to 20 carbon atoms;

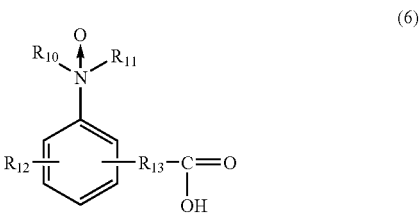

(6)

where
$R_{10}$, $R_{11}$, $R_{12}$, and $R_{13}$ represent the same meanings as before;

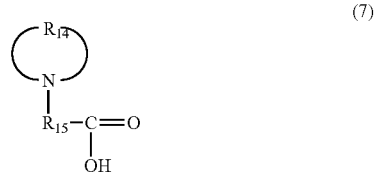

(7)

where
$R_{14}$ represents an optionally substituted linear or branched alkylene group having 2 to 20 carbon atoms, wherein one or a plurality of the groups selected from a carbonyl group, an ether group, an ester group, and a sulfide may be contained between the carbon-carbon bond of the alkylene group, $R_{15}$ represents a linear, a branched, or a cyclic alkylene group having 1 to 20 carbon atoms, or an arylene group having 6 to 20 carbon atoms;

and the basic component further containing at least one or more kinds of an amine compound and an amine oxide compound represented by the following general formulae (8) and (9),

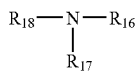
(8)

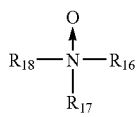
(9)

where each $R_{16}$, $R_{17}$, and $R_{18}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 2 to 10 carbon atoms, or an alkyl thioalkyl group having 1 to 10 carbon atoms, wherein two of $R_{16}$, $R_{17}$, and $R_{18}$ may form a cyclic structure or an aromatic ring by bonding; and (D) an organic solvent;

and a solid component concentration is controlled so that the chemically amplified resist film having the film thickness of 10 to 100 nm is obtained by a spin coating method.

2. The resist patterning process according to claim 1, wherein a chromium compound film is formed on the outermost surface layer of the photomask blank.

3. The resist patterning process according to claim 2, wherein the photomask blank has a length of 120 to 180 mm on a side, and the rotation speed at the time of the application by the spin coating method is 1,000 to 3,000 revolutions/minute.

\* \* \* \* \*